United States Patent
Joo et al.

(10) Patent No.: US 11,289,544 B2
(45) Date of Patent: Mar. 29, 2022

(54) DISPLAY DEVICE INCLUDING WAVELENGTH CONVERSION PATTERNS HAVING CORRESPONDING PROTRUDING AND INDENTATION PATTERN PARTS

(71) Applicant: Samsung Display Co. Ltd., Yongin-si (KR)

(72) Inventors: Sun Kyu Joo, Suwon-si (KR); Keun Chan Oh, Hwaseong-si (KR); Byung Chul Kim, Suwon-si (KR); In Ok Kim, Osan-si (KR); In Seok Song, Pocheon-si (KR); Gak Seok Lee, Hwaseong-si (KR); Chang Soon Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 180 days.

(21) Appl. No.: 16/509,272

(22) Filed: Jul. 11, 2019

(65) Prior Publication Data
US 2020/0258944 A1  Aug. 13, 2020

(30) Foreign Application Priority Data

Feb. 11, 2019  (KR) ........................ 10-2019-0015462

(51) Int. Cl.
*H01L 27/32* (2006.01)
*H01L 51/52* (2006.01)

(52) U.S. Cl.
CPC ........ *H01L 27/322* (2013.01); *H01L 27/3244* (2013.01); *H01L 51/5268* (2013.01); *H01L 51/5284* (2013.01); *H01L 2251/5369* (2013.01)

(58) Field of Classification Search
CPC .............. H01L 27/322; H01L 27/3244; H01L 51/5268; H01L 51/5284
See application file for complete search history.

(56) References Cited

U.S. PATENT DOCUMENTS

| | | | |
|---|---|---|---|
| 2014/0267985 A1* | 9/2014 | Sato | G02F 1/133516 349/106 |
| 2017/0058199 A1 | 3/2017 | Jang et al. | |
| 2017/0221969 A1 | 8/2017 | Steckel et al. | |
| 2017/0271554 A1 | 9/2017 | Coe-Sullivan et al. | |
| 2018/0292926 A1* | 10/2018 | Ye | H01L 27/322 |

\* cited by examiner

*Primary Examiner* — Matthew E. Gordon
(74) *Attorney, Agent, or Firm* — Cantor Colburn LLP

(57) ABSTRACT

A display device is provided. A display device includes a plurality of pixels arranged in a row axis and in a column axis that intersects the row axis, a first substrate on which a light-emitting element disposed in each of the pixels is disposed, a second substrate which faces the first substrate, and a first wavelength conversion pattern disposed on the second substrate in a first pixel column and which converts wavelength of light emitted from the light-emitting element. The first wavelength conversion pattern includes a first main pattern part arranged in a stripe fashion along the column axis and a protruding pattern part projected from the first main pattern part toward at least one of first and second directions of the row axis.

16 Claims, 17 Drawing Sheets

FIG. 11
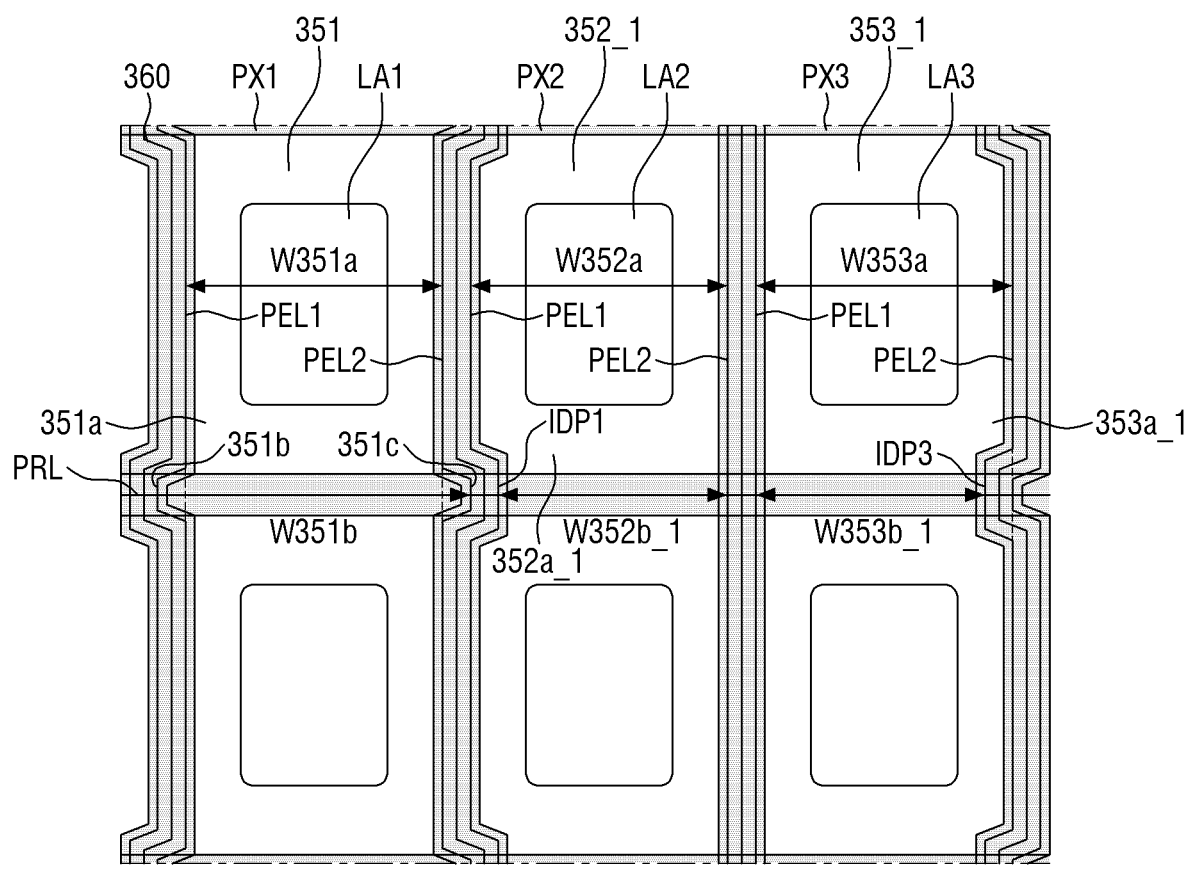
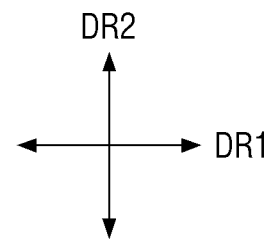

FIG. 12
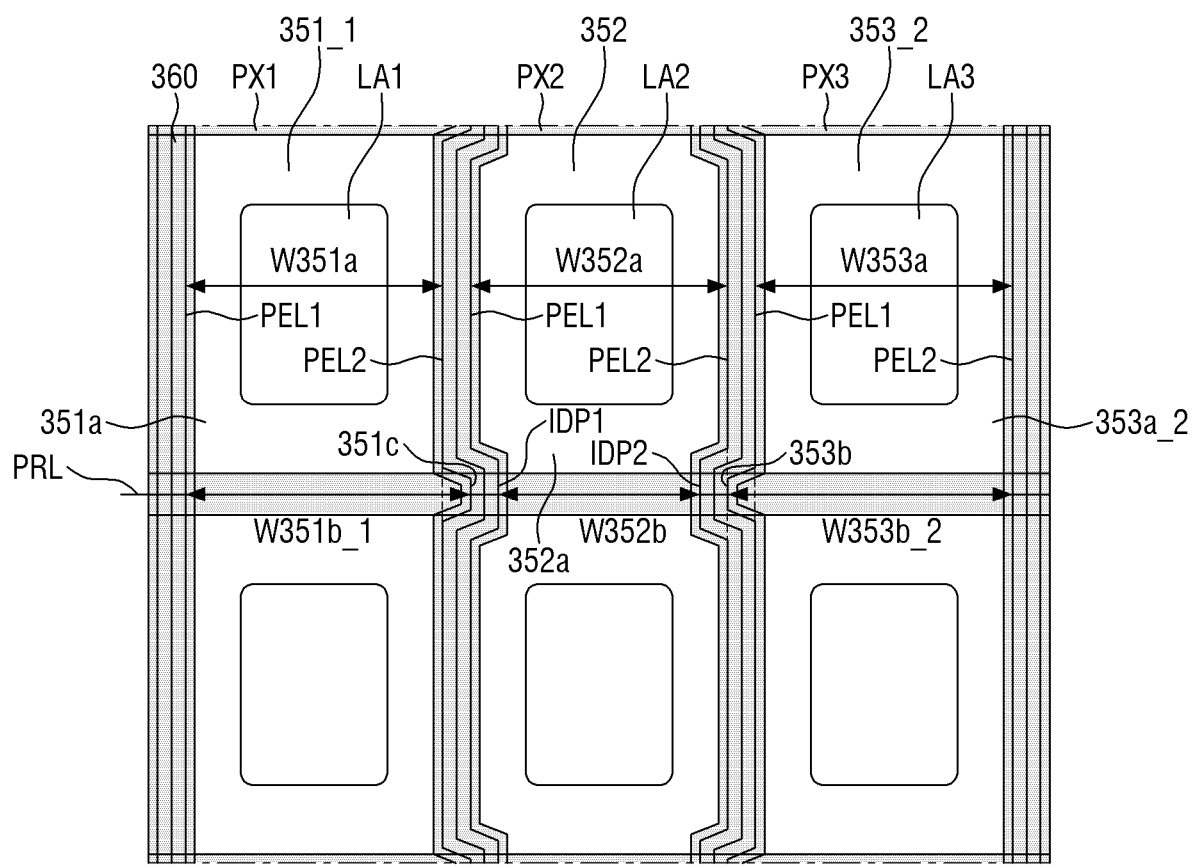
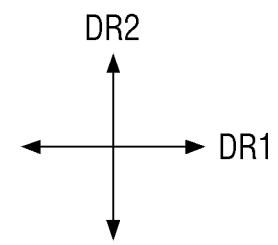

FIG. 14
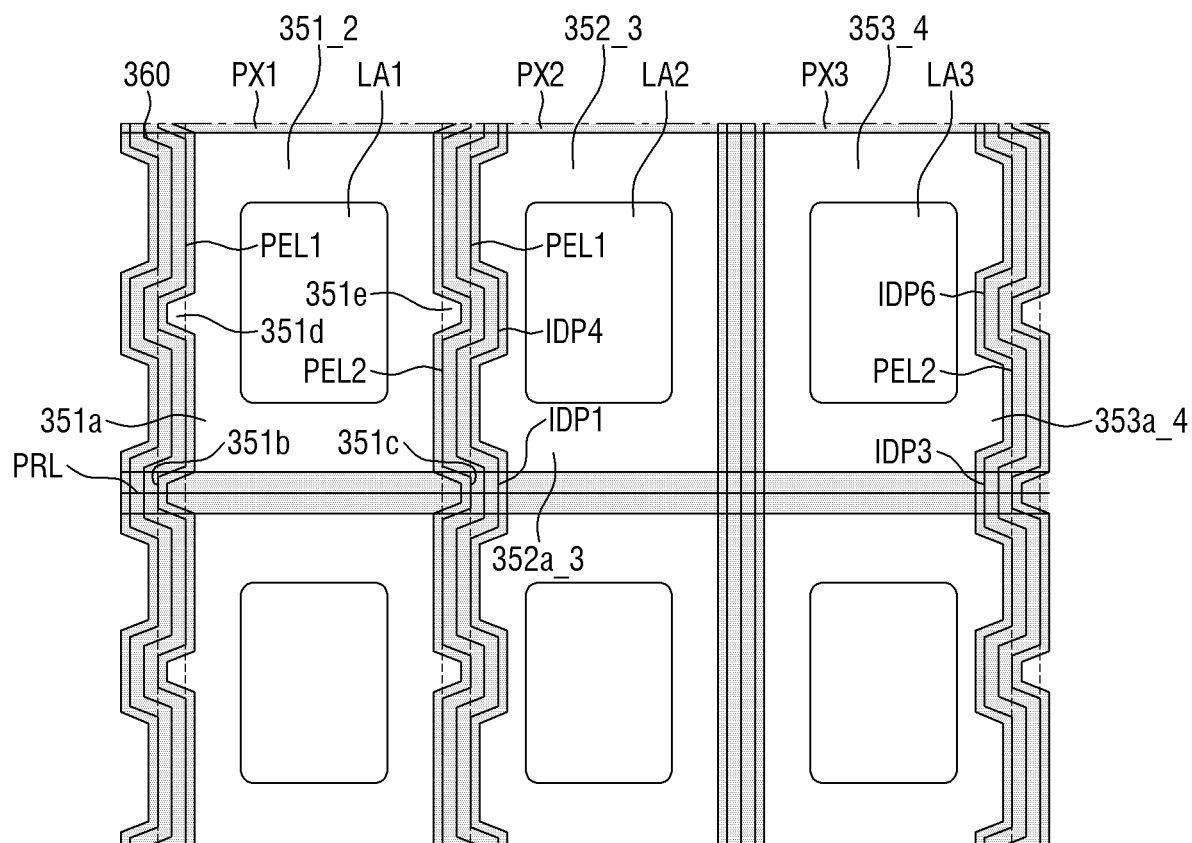
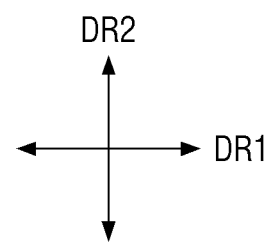

FIG. 15
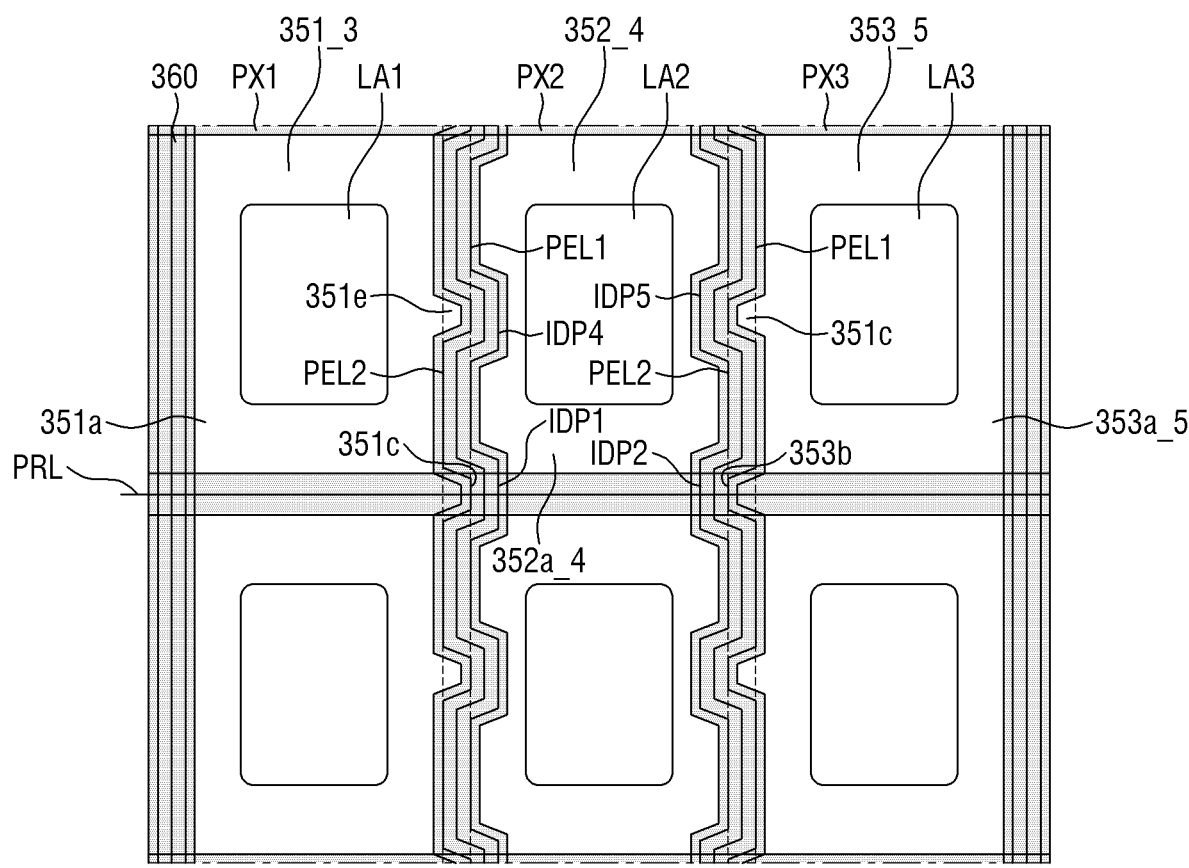
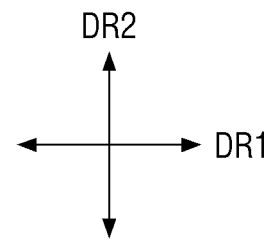

FIG. 16
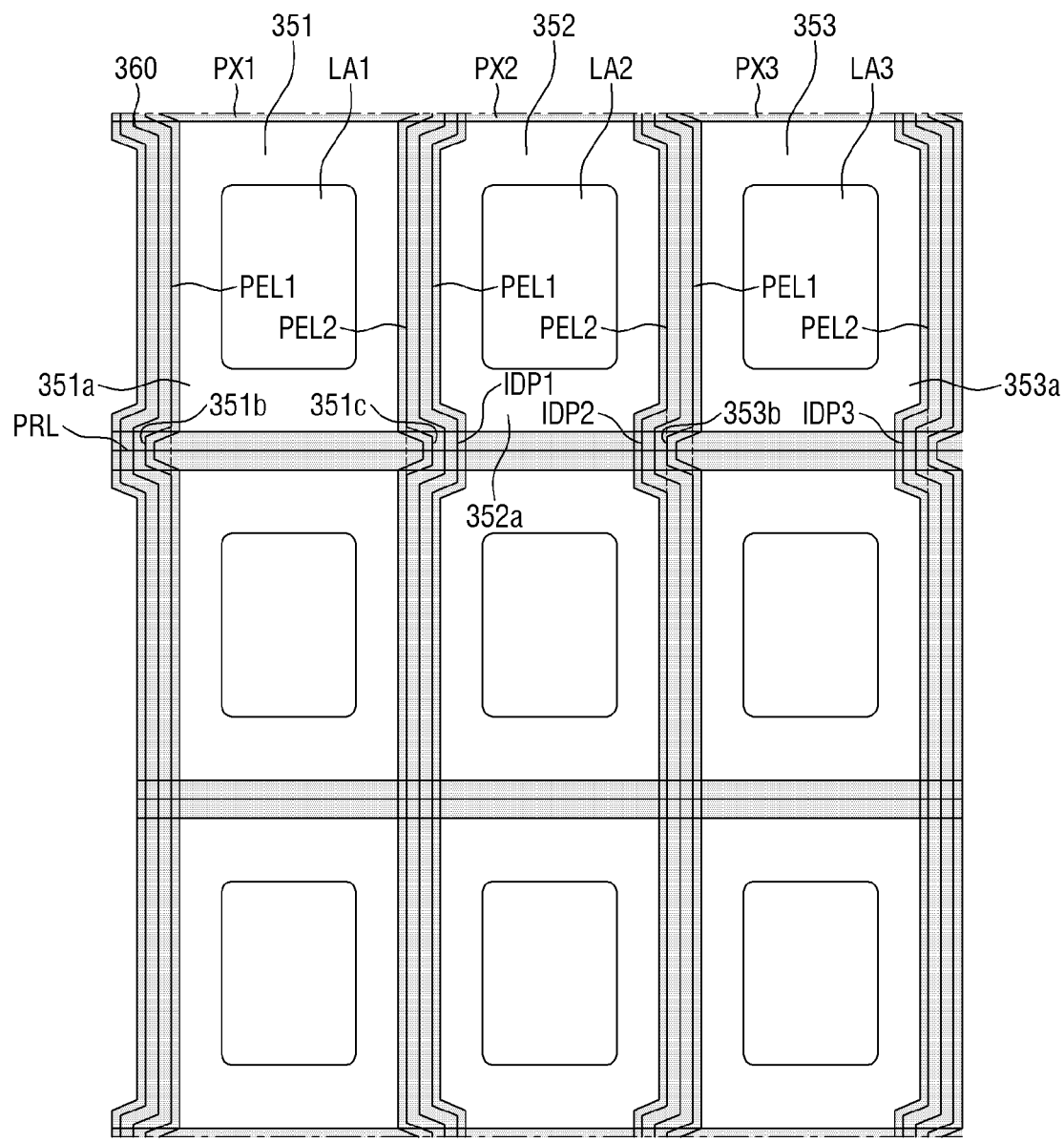
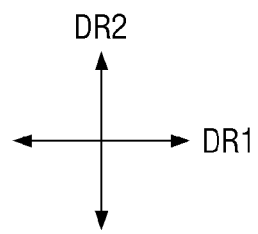

DISPLAY DEVICE INCLUDING WAVELENGTH CONVERSION PATTERNS HAVING CORRESPONDING PROTRUDING AND INDENTATION PATTERN PARTS

This application claims priority to Korean Patent Application No. 10-2019-0015462, filed on Feb. 11, 2019, and all the benefits accruing therefrom under 35 U.S.C. § 119, the content of which in its entirety is herein incorporated by reference.

BACKGROUND

1. Field

The present disclosure relates to a display device and a method of manufacturing the same.

2. Description of the Related Art

Display devices have increasingly become important with the development of multimedia. Accordingly, various display devices such as a liquid crystal display device ("LCD"), an organic light-emitting diode ("OLED") display device, and the like have been developed.

The OLED display device includes OLEDs, which are self-luminous elements. An OLED includes two electrodes facing each other and an organic light-emitting layer interposed between the two electrodes. Electrons and holes from the two electrodes may recombine in the light-emitting layer to generate excitons, and in response to the transition of the excitons change from the excited state to the ground state, light may be emitted.

Since the OLED display device does not need a separate light source, the OLED display device has been spotlighted as a next-generation display device due to its numerous advantages such as low power consumption, thinness, light-weightiness, wide viewing angles, high luminance and contrast, and fast response speed.

SUMMARY

The OLED display device needs light conversion patterns for converting light emitted from light-emitting areas into light of a predetermined wavelength, and the light conversion patterns may include stripes. Since the light emitted from the light-emitting areas may also be converted even by light conversion patterns in areas that overlap with non-light-emitting areas, the light conversion efficiency for a predetermined wavelength can be improved by expanding the light conversion patterns in the areas that overlap with the non-light-emitting areas.

Exemplary embodiments of the present disclosure provide a display device having light conversion patterns expanded in areas that overlap with non-light-emitting areas and thereby capable of providing an improved light conversion efficiency for a predetermined wavelength.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, a display device includes a plurality of pixels arranged in a row axis and in a column axis that intersects the row axis, a first substrate on which a light-emitting element disposed in each of the pixels is disposed, a second substrate which faces the first substrate, and a first wavelength conversion pattern disposed on the second substrate in a first pixel column and which converts wavelength of light emitted from the light-emitting element. The first wavelength conversion pattern includes a first main pattern part arranged in a stripe fashion along the column axis and a protruding pattern part projected from the first main pattern part toward at least one of first and second directions of the row axis.

In an exemplary embodiment, the protruding pattern part may be disposed at a pixel row boundary.

In an exemplary embodiment, the protruding pattern part may be provided in plural and may include a first protruding pattern part projected from the first main pattern part toward the first direction of the row axis and a second protruding pattern part projected from the first main pattern part toward the second direction of the row axis.

In an exemplary embodiment, the display device may further include a second pixel column disposed toward the second direction of the row axis from the first pixel column, and a light-transmitting pattern disposed along the second pixel column and which includes a first indentation pattern part recessed toward the second direction of the row axis along the second protruding pattern part.

In an exemplary embodiment, the display device may further include a third pixel column disposed toward the second direction of the row axis from the second pixel column and which extends in the column axis, and a second wavelength conversion pattern which includes a second main pattern part disposed along the third pixel column and a third protruding pattern part projected from the second main pattern part toward the first direction of the row axis.

In an exemplary embodiment, the second wavelength conversion pattern may further include a second indentation pattern part recessed toward the first direction of the row axis along the third protruding pattern part.

In an exemplary embodiment, the first, second, and third pixel columns may be repeatedly arranged along the row axis, and the second wavelength conversion pattern may further include a third indentation pattern part recessed toward the first direction of the row axis along the first protruding pattern part of the first wavelength conversion pattern.

In an exemplary embodiment, the display device may further include a third pixel column disposed toward the second direction of the row axis from the second pixel column and which extends in the column axis, and a second wavelength conversion pattern disposed in the third pixel column, The first, second, and third pixel columns are repeatedly arranged along the row axis.

In an exemplary embodiment, the second wavelength conversion pattern may further include a second indentation pattern part is recessed toward the first direction of the row axis along the first protruding pattern part.

In an exemplary embodiment, the protruding pattern parts may be provided in plural and include a first protruding pattern part projected from the first main pattern part toward the second direction of the row axis.

In an exemplary embodiment, the display device may further include a second pixel column disposed toward the second direction of the row axis from the first pixel column and which extends in the column axis, a second wavelength conversion pattern disposed along the second pixel column and which includes a first indentation pattern part recessed toward the second direction of the row axis along the first protruding pattern part, a third pixel column disposed toward the second direction of the row axis from the second pixel column and which extends in the column axis, and a second wavelength conversion pattern which includes a second main pattern part disposed along the third pixel column and a second protruding pattern part projected from the second main pattern part toward the first direction of the row axis.

In an exemplary embodiment, the first indentation pattern part and the second protruding pattern part may be disposed at a pixel row boundary.

In an exemplary embodiment, the protruding pattern parts may be provided in plural and the protruding pattern part may not disposed at some pixel row boundaries.

In an exemplary embodiment, the display device may further include a light-shielding pattern disposed on the first substrate along pixel row boundaries and along pixel column boundaries, where the light-shielding pattern overlaps with the protruding pattern parts.

According to another exemplary embodiment of the present disclosure, a display device includes a plurality of pixels arranged in a row axis and in a column axis that intersects the row axis, a first substrate on which a light-emitting element disposed in each of the pixels is disposed, a second substrate which faces the first substrate, and a wavelength conversion pattern disposed on the second substrate in a first pixel column and which converts wavelength of light emitted from the light-emitting element. The wavelength conversion pattern includes a first pattern part which has a first width in the row axis and a second pattern part which has a second width greater than the first width, in the row axis.

In an exemplary embodiment, the second pattern part may include parts that extend from both edges, in the row axis, of the first pattern part in a plan view.

In an exemplary embodiment, the parts of the second pattern part that extend from both edges of the first pattern part may be disposed at a pixel row boundary.

In an exemplary embodiment, the wavelength conversion pattern may further include a third pattern part which has a third width greater than the first width in the row axis, and the third pattern part includes parts that extend from both edges of the first pattern part in a plan view.**

In an exemplary embodiment, the parts of the third pattern part that extend from both edges of the first pattern part may be not disposed at the pixel row boundary.

In an exemplary embodiment, the display device may further include a light-shielding pattern disposed on the first substrate along pixel row boundaries and along pixel column boundaries, where the light-shielding pattern overlaps with the parts of the second pattern part that extend from both edges of the first pattern part.

According to the aforementioned and other exemplary embodiments of the present disclosure, a display device having light conversion patterns expanded in areas that overlap with non-light-emitting areas and thereby capable of providing an improved light conversion efficiency for a predetermined wavelength can be provided.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which:

FIG. 11 is a plan view of still another exemplary embodiment of a display device according to the present disclosure;

FIG. 12 is a plan view of still another exemplary embodiment of a display device according to the present disclosure;

FIG. 14 is a plan view of still another exemplary embodiment of a display device according to the present disclosure;

FIG. 15 is a plan view of still another exemplary embodiment of a display device according to the present disclosure;

FIG. 16 is a plan view of still another exemplary embodiment of a display device according to the present disclosure.

DETAILED DESCRIPTION

Hereinafter, exemplary embodiments of the present invention will be described with reference to the attached drawings.

The advantages and features of the invention and methods for achieving the advantages and features will be apparent by referring to the exemplary embodiments to be described in detail with reference to the accompanying drawings. However, the invention is not limited to the exemplary embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
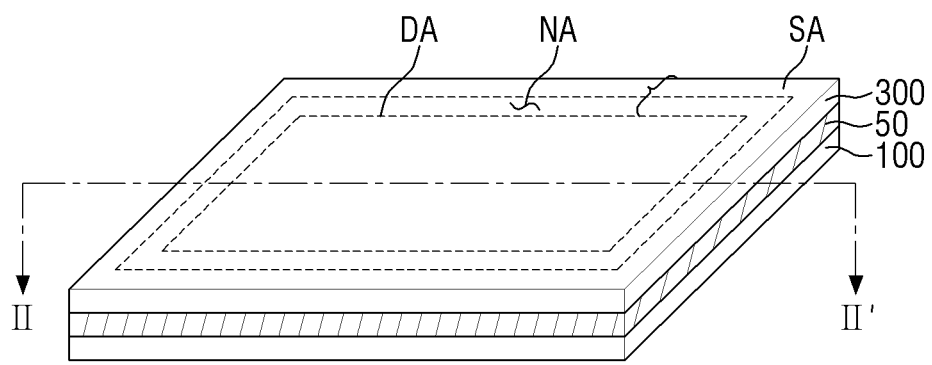
FIG. 1 is a perspective view of an exemplary embodiment of a display device according to the present disclosure.
Figure 2:
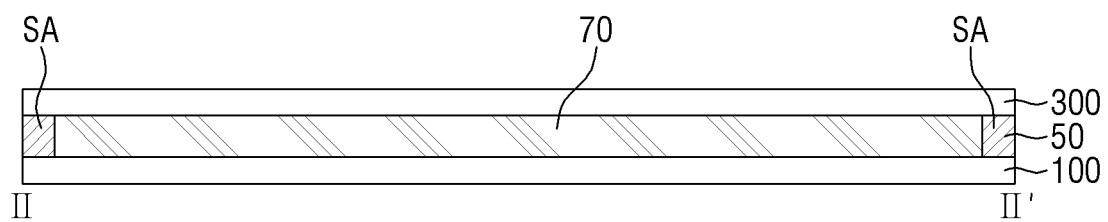
FIG. 2 is a cross-sectional view taken along line II-II' of FIG. 1.

FIG. 1 is a perspective view of an exemplary embodiment of a display device according to the present disclosure, and FIG. 2 is a cross-sectional view taken along line II-II' of FIG. 1.

Referring to FIGS. 1 and 2, a display device 1 may be applicable to various electronic devices such as a tablet personal computer ("PC"), a smartphone, a car navigation unit, a camera, a central information display ("CID") provided in an automobile, a wristwatch-type electronic device, a personal digital assistant ("PDA"), a portable multimedia player ("PMP"), a small- or medium-sized electronic device such as a gaming device, a television ("TV"), an external billboard, a monitor, a PC, or a notebook computer, but the present disclosure is not limited thereto. That is, the display device 1 may also be applicable to various electronic devices other than those set forth herein.

Figure 3:
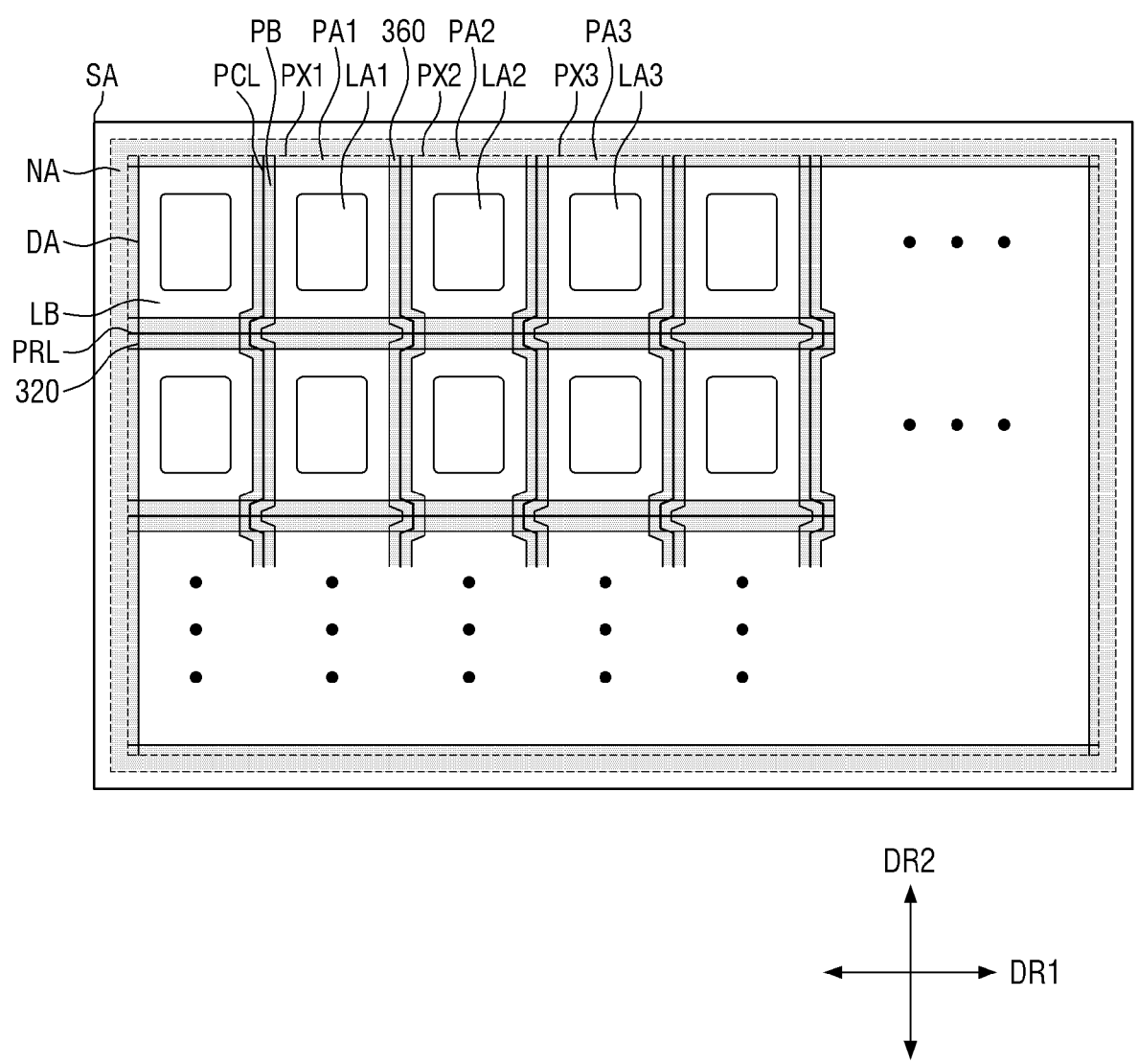
FIG. 3 is a plan view of the display device of FIG. 1.

The display device 1 may have a rectangular shape in a plan view. The display device 1 may include a pair of short sides extending in one axis and a pair of long sides extending in another axis that intersects the axis in which the short sides extend. For example, the long sides of the display device 1 may extend in a first axis DR1, and the short sides of the display device 1 may extend in a second axis DR2 that interests the first axis DR1 in a plan view as shown in FIG. 3. The corners at which the long sides and the short sides of the display device 1 meet may be right-angled in a plan view, but the present disclosure is not limited thereto. Alternatively, the corners at which the long sides and the short sides of the display device 1 meet may be rounded. The planar shape of the display device 1 is not particularly limited, and the display device 1 may have various shapes other than a rectangular shape, such as a circular, square, or elliptical shape.

The display device 1 may include a display area DA in which images are displayed and a non-display area NA in which no images are displayed.

The display area DA may be disposed at the center of the display device 1. The display device DA may include a plurality of pixels.

The non-display area NA may be disposed on the outside of the display area DA and may surround the display area DA. The non-display area NA may include dummy-light-emitting areas that have substantially the same structure as the light emitting areas of the pixels, but are controlled not to emit light. Alternatively, the non-display area NA may include the light emitting areas of the pixels, but the emission of light from the non-display area NA may be blocked by the light-shielding member.

The non-display area NA may further include a sealing area SA. The sealing area SA may be an area in which a sealing member 50, which will be described later, is disposed. The sealing area SA may be continuously disposed along edge portions of the display device 1 including both long sides and both short sides of the display device 1.

As illustrated in FIG. 2, the display device 1 may include a light provider 100, a light converter 300 facing the light provider 100, a filler member 70 interposed between the light provider 100 and the light converter 300, and the sealing member 50. The sealing member 50 bonds the light provider 100 and the light converter 300 together along the edges of each of the light provider 100 and the light converter 300 and is disposed in the sealing area SA. The sealing member 50 may be in the shape of a continuous rectangular frame disposed along the sealing area SA in a plan view.

The light provider 100 may include elements and circuits for displaying an image (i.e., pixel circuits such as switching elements, a bank layer defining light-emitting areas and non-light-emitting areas in the display area DA, and organic light-emitting diodes ("OLEDs")). The light provider 100 may be a display substrate.

The light converter 300 is disposed above the light provider 100 and faces the light provider 100. The light converter 300 may be a counterpart substrate facing the display substrate. The light converter 300 may be a color conversion substrate including light conversion patterns that change the color of incident light provided by the light provider 100, but the present disclosure is not limited thereto.

In the non-display area NA, the sealing member 50 may be disposed between the light provider 100 and the light converter 300. The sealing member 50 may be disposed along the edges of each of the light provider 100 and the light converter 300, and may surround the display area DA in a plan view. Also, the sealing member 50 may be disposed between the light provider 100 and the light converter 300 in a thickness axis. The sealing member 50 may couple the light provider 100 and the light converter 300 together. That is, the light provider 100 and the light converter 300 may be coupled to each other by the sealing member 50. The sealing member 50 may include various adhesive materials.

The filler member 70 may be disposed in a space surrounded by the light provider 100, the light converter 300, and the sealing member 50. The filler member 70 may include a material capable of transmitting light therethrough and may have a buffer function. In one exemplary embodiment, the filler member 70 may include an organic material. For example, the filler member 70 may include a silicon-based organic material, an epoxy-based organic material, or an acrylic organic material, but the present disclosure is not limited thereto.

Figure 4:
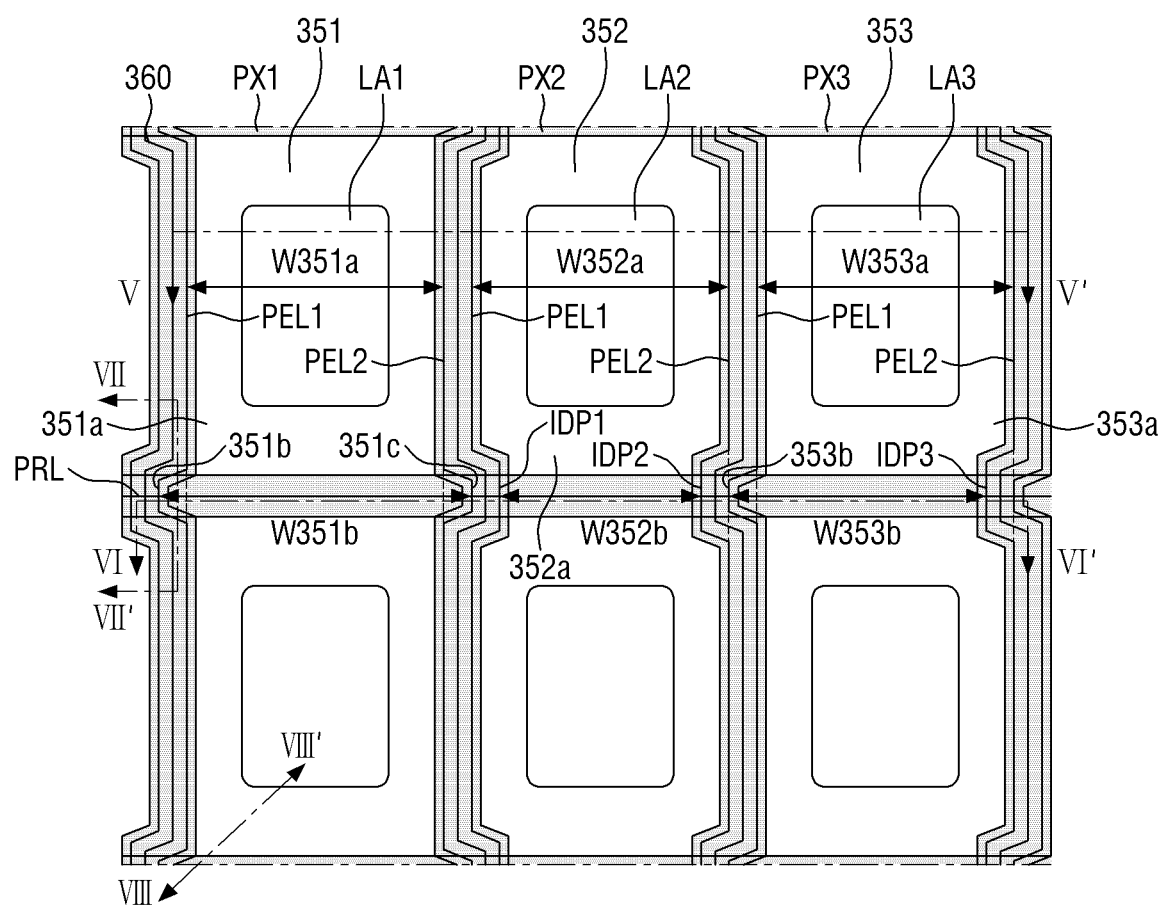
FIG. 4 is an enlarged plan view of the display device of FIG. 3.
Figure 5:
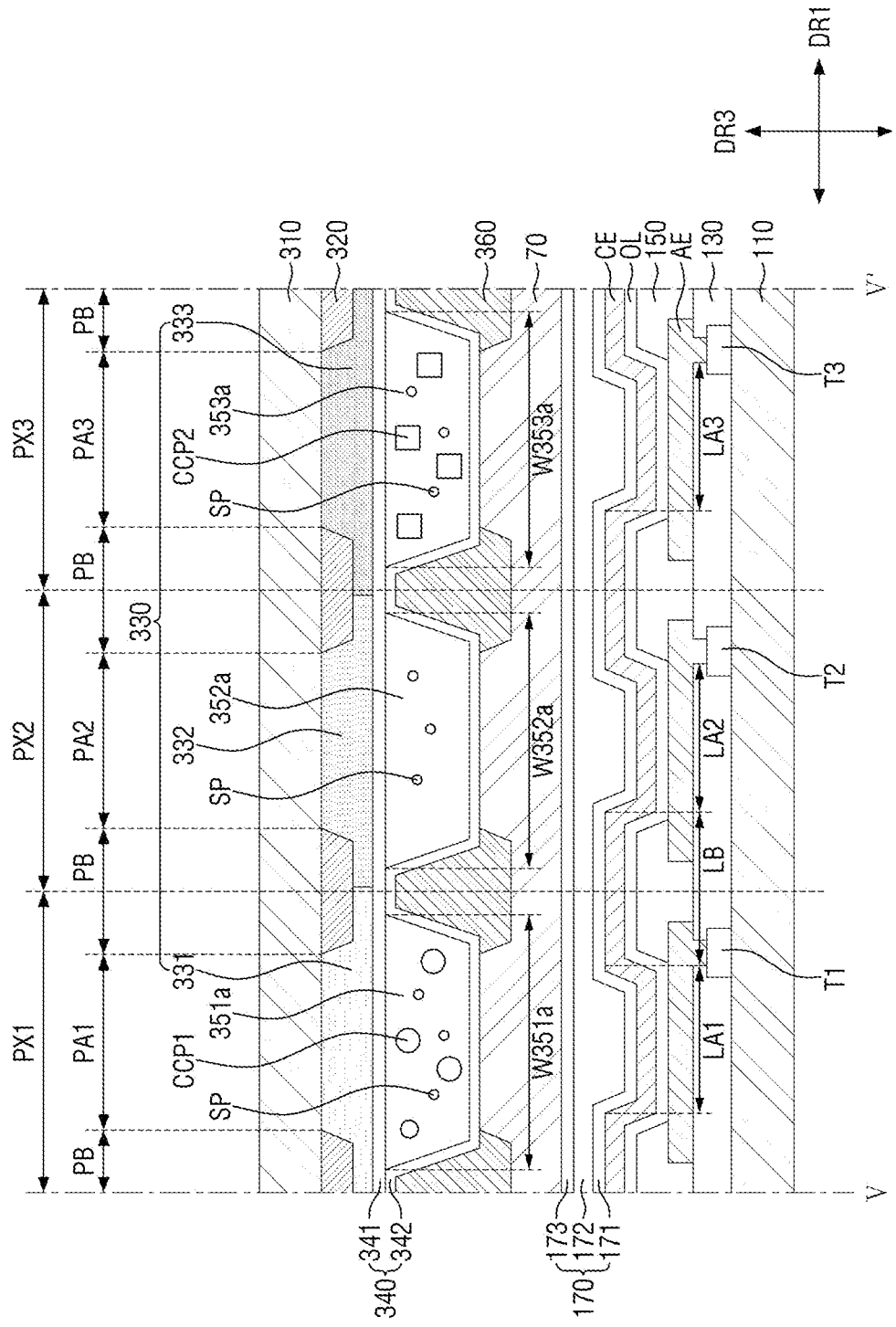
FIG. 5 is a cross-sectional view taken along line V-V' of FIG. 4.
Figure 6:
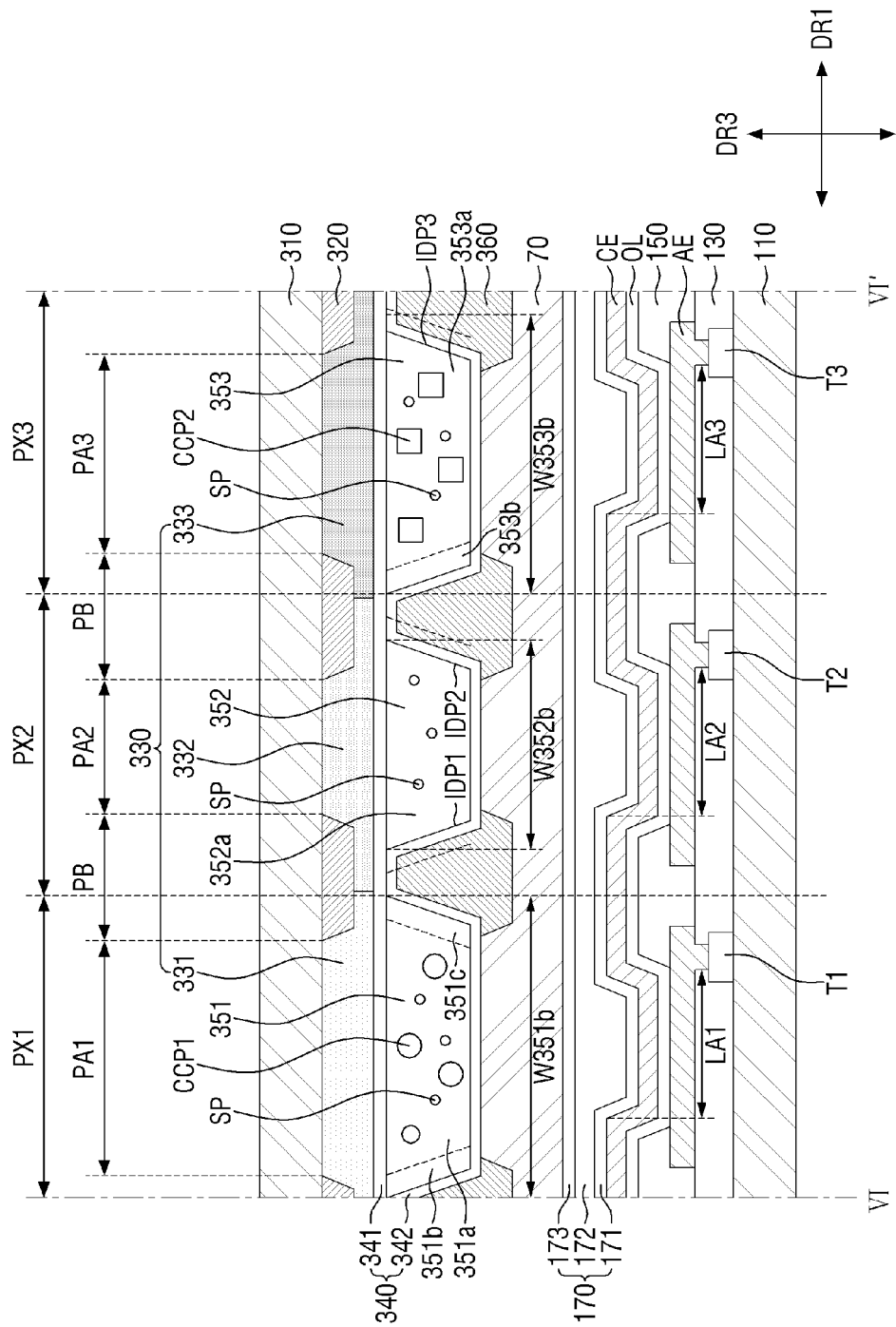
FIG. 6 is a cross-sectional view taken along line VI-VI' of FIG. 4.
Figure 7:
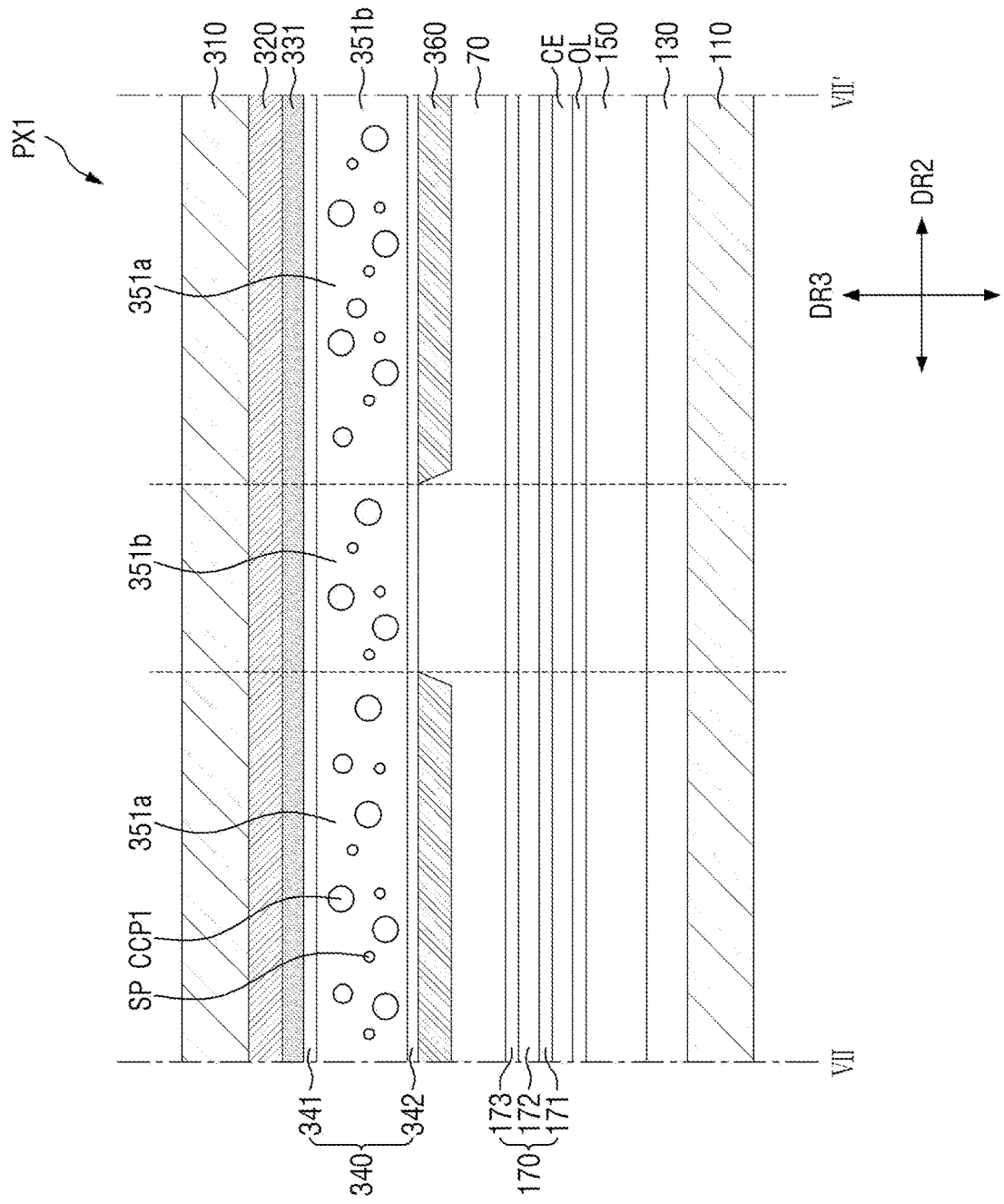
FIG. 7 is a cross-sectional view taken along line VII-VII' of FIG. 4.
Figure 8:
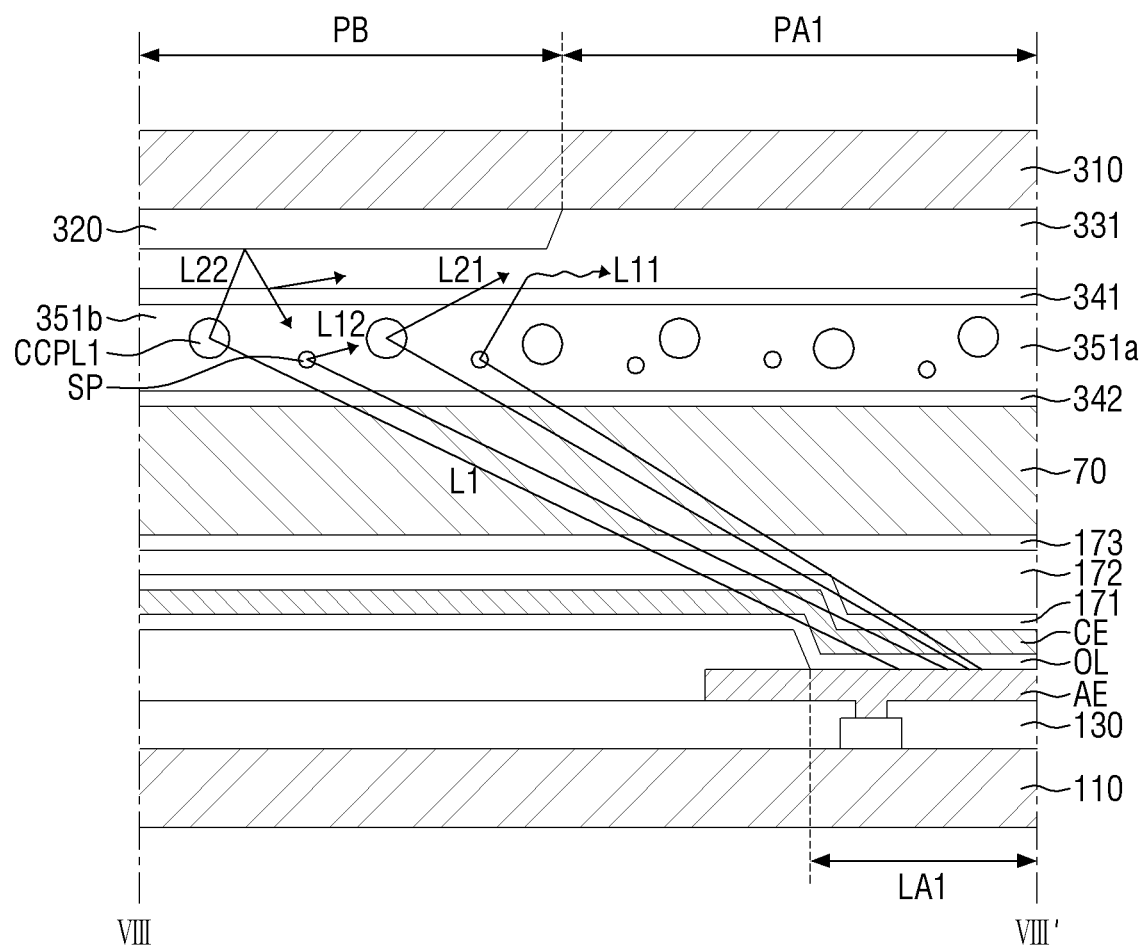
FIG. 8 is a cross-sectional view taken along line VIII-VIII' of FIG. 4.
Figure 9:
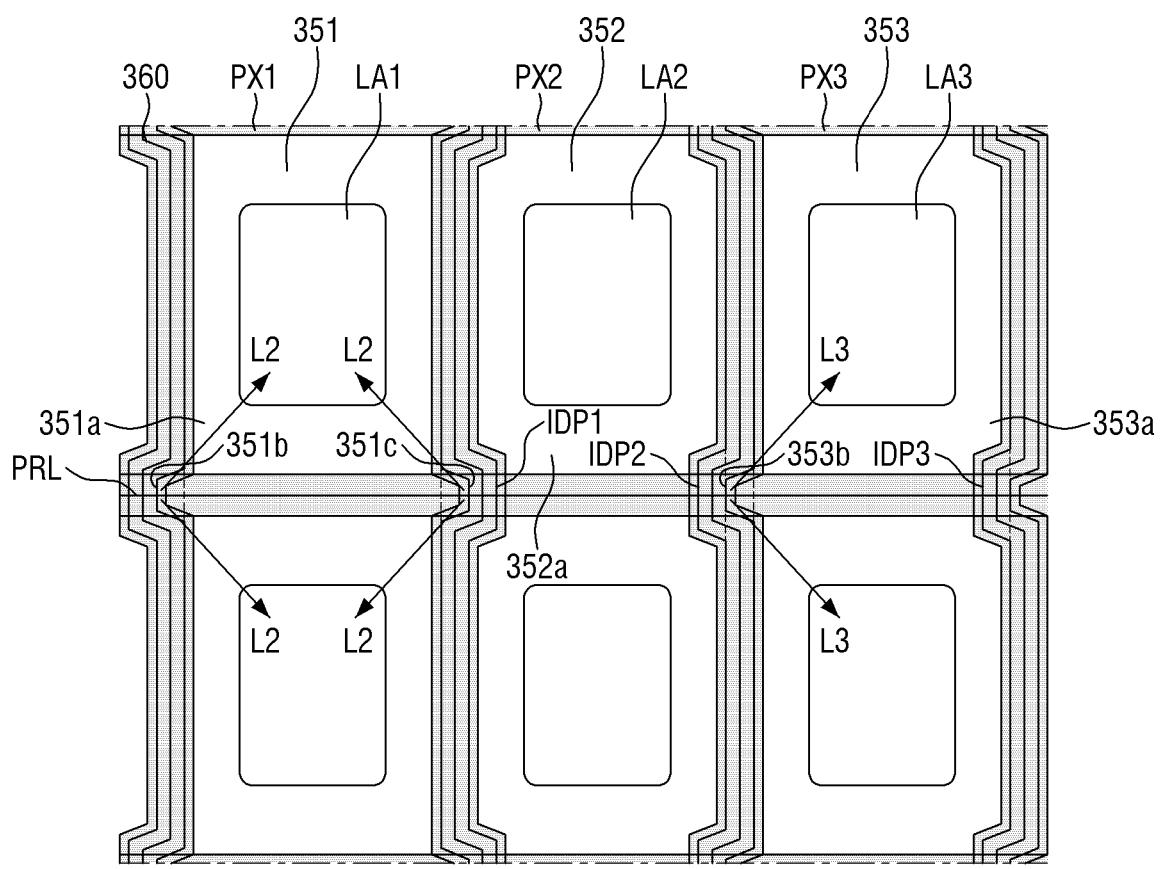
FIG. 9 is a plan view illustrating how protruding pattern parts can improve the light conversion efficiency for a predetermined wavelength.

FIG. 3 is a plan view of the display device of FIG. 1, FIG. 4 is an enlarged plan view of the display device of FIG. 3, FIG. 5 is a cross-sectional view taken along line V-V' of FIG. 4, FIG. 6 is a cross-sectional view taken along line VI-VI' of FIG. 4, FIG. 7 is a cross-sectional view taken along line VII-VII' of FIG. 4, and FIG. 8 is a cross-sectional view taken along line VIII-VIII' of FIG. 4. FIG. 9 is a plan view illustrating how protruding pattern parts can improve the light conversion efficiency for a predetermined wavelength.

Referring to FIGS. 3 through 9, in the display area DA, a plurality of pixels (e.g., PX1, PX2, and PX3) may be arranged in a matrix. The pixels may include a first pixel PX1 displaying a first color, a second pixel PX2 displaying a second color, and a third pixel PX3 displaying a third color. The first pixel PX1 may be a green pixel emitting green light having a peak wavelength of about 510 nanometers (nm) to about 550 nm, the second pixel PX2 may be a blue pixel emitting blue light having a peak wavelength of about 430 nm to about 470 nm, and the third pixel PX3 may be a red pixel emitting red light having a peak wavelength of about 610 nm to about 650 nm.

The pixels (e.g., PX1, PX2, and PX3) may have different sizes in a plan view. For example, in a plan view, the third pixel PX3 may be larger in size than the first and second pixels PX1 and PX2, and the first pixel PX1 may be larger in size than the second pixel PX2. However, the present disclosure is not limited to this example. In another example, in a plan view, the third pixel PX3 may be larger in size than the first and second pixels PX1 and PX2, and the first pixel PX1 may be larger in size than the second pixel PX2.

Each of the first, second, and third pixels PX1, PX2, and PX3 may be arranged in a stripe fashion. For example, each of the first, second, and third pixels PX1, PX2, and PX3 may be arranged along the second axis DR2 in a stripe fashion. Pixels belonging to the same pixel column may display the same color. For example, a plurality of the first pixels PX1 may be arranged in a first pixel column, a plurality of the second pixels PX2 may be arranged in a second pixel column, a plurality of the third pixels PX3 may be arranged in a third pixel column, and this pattern of arrangement may be repeated along a row axis (i.e., the first axis DR1).

The pixels (e.g., PX1, PX2, and PX3) may include light-outputting areas (e.g., PA1, PA2, and PA3) and non-light-outputting areas PB. The light-outputting areas (e.g., PA1, PA2, and PA3) are defined as areas that output light through a display surface of the display device 1, and the non-light-outputting areas PB are defined as areas that do not output light through the display surface of the display device 1. The non-light-outputting areas PB may be disposed to surround the light-outputting areas (e.g., PA1, PA2, and PA3). The light-outputting areas (e.g., PA1, PA2, and PA3) and the non-light-outputting areas PB may be defined by a first light-shielding pattern 320 that will be described later.

The pixels (e.g., PX1, PX2, and PX3) may further include light-emitting areas (e.g., LA1, LA2, and LA3) and non-light-emitting areas LB disposed on the periphery of the light-emitting areas (e.g., LA1, LA2, and LA3). The light-emitting areas (e.g., LA1, LA2, and LA3) are defined as areas in which light is emitted by an organic layer OL. The light-emitting areas (e.g., LA1, LA2, and LA3) and the non-light-emitting areas LB are defined by a bank layer 150 that will be described later. The light-emitting areas (e.g., LA1, LA2, and LA3) may be disposed in the light-outputting areas (e.g., PA1, PA2, and PA3), and the non-light-emitting areas LB may be disposed in the non-light-outputting areas PB. The boundaries (e.g., PCL and PRL) between the pixels (e.g., PX1, PX2, and PX3) may be located in the non-light-emitting areas LB.

The pixels (e.g., PX1, PX2, and PX3) may have different planar profiles. As illustrated in FIG. 4, at each pixel row boundary PRL, the first pixel PX1 may include protruding pattern parts (e.g., 351b and 351c), which are projected toward the outside of the first pixel PX1 along the first axis DR1, the second pixel PX2 may include indentation pattern parts (e.g., IDP1 and IDP2), which are recessed toward the inside of the first pixel PX1 along the first axis DR1, and the third pixel PX3 may include a protruding pattern part (e.g., 353b), which is projected toward a first direction of the first axis DR1, and an indentation pattern part (e.g., IDP3), which is recessed toward the first direction of the first axis DR1. The protruding pattern part(s) and/or the indentation pattern part(s) of each of the pixels (e.g., PX1, PX2, and PX3) may be disposed along pixel row boundaries PRL. As used herein, the term "first direction" of an axis refers to one direction of the axis, and "second direction" refers to the opposite direction of the axis.

The pixel row boundaries PRL and pixel column boundaries PCL may be located at the boundaries between the pixels (e.g., PX1, PX2, and PX3). The pixel row boundaries PRL may extend in the first axis DR1, and the pixel column boundaries PCL may extend substantially in the second axis DR2.

The pixel column boundaries PCL may be disposed along the planar profiles of the pixels (e.g., PX1, PX2, and PX3). That is, the pixel column boundary PCL between the first and second pixels PX1 and PX2 may be disposed along the planar profiles of the first and second pixels PX1 and PX2, the pixel column boundary PCL between the second and third pixels PX2 and PX3 may be disposed along the planar profiles of the second and third pixels PX2 and PX3, and the pixel column boundary PCL between the third and first pixels PX3 and PX1 may be disposed along the planar profiles of the third and first pixels PX3 and PX1 in the case that the sequential arrangement of first, second, and third pixels PX1, PX2, and PX3 is repeated.

Light-shielding patterns (e.g., 320 and 360) may be disposed at the boundaries between the pixels (e.g., PX1, PX2, and PX3). The light-shielding patterns (e.g., 320 and 360) may include a first light-shielding pattern 320 disposed between color filters 330 and a second light-shielding pattern 360 disposed between light conversion patterns (e.g., 351, 352, and 353) as shown in FIG. 5.

The first light-shielding pattern 320 may be disposed along the pixel row boundaries PRL and along the pixel column boundaries PCL, and the second light-shielding pattern 360 may be disposed along the pixel column boundaries PCL, but not along the pixel row boundaries PRL.

The first and second light-shielding patterns 320 and 360 may be disposed to overlap with the pixel column boundaries PCL, which are disposed along the planar profiles of the pixels (e.g., PX1, PX2, and PX3). In some exemplary embodiments, the first and second light-shielding patterns 320 and 360 may be disposed substantially along the pixel column boundaries PCL but may have a linear shape even in the area of the protruding pattern part(s) and/or the indentation pattern part(s) regardless of the presence of the protruding pattern part(s) and/or the indentation pattern part(s) of each of the pixels (e.g., PX1, PX2, and PX3).

Referring to FIG. 5, the light provider 100 will hereinafter be described.

The light provider 100 may include a first base substrate 110, switching elements (e.g., T1, T2, and T3), an insulating film 130, pixel electrodes AE, the bank layer 150, the organic layer OL, a common electrode CE, and a thin-film encapsulation layer 170.

The first base substrate 110 may include a light-transmitting material. In an exemplary embodiment, the first base substrate 110 may be a glass substrate or a plastic substrate.

On the first base substrate 110, one or more switching elements (e.g., T1, T2, and T3) may be disposed in each of the pixels (e.g., PX1, PX2, and PX3). Although not specifically illustrated, multiple signal wires (e.g., gate wires, data wires, power wires, and the like) may be further disposed on the first base substrate 110 to transmit signals to the switching elements (e.g., T1, T2, and T3).

The insulating film 130 may be disposed on the switching elements (e.g., T1, T2, and T3). The insulating film 130 may include an organic film. In an exemplary embodiment, for example, the insulating film 130 may include an acrylic resin, an epoxy resin, an imide resin, or an ester resin.

On the insulating film 130, the pixel electrodes AE may be disposed in the pixels (e.g., PX1, PX2, and PX3). The pixel electrodes AE may be connected to the switching elements (e.g., T1, T2, and T3) via holes that are defined in the insulating film 130.

In one exemplary embodiment, the pixel electrodes AE may be the anode electrodes of OLEDs. The pixel electrodes AE may include a high-work-function material that facilitates the injection of holes, such as, for example, indium tin oxide ("ITO"), indium zinc oxide ("IZO"), zinc oxide (ZnO), or indium oxide ($In_2O_3$). In a case where the display device 1 is a top emission display device, the pixel electrodes AE may further include a reflective material layer.

The bank layer 150 may be disposed on the pixel electrodes AE. The bank layer 150 may be in a lattice shape disposed along the pixel column boundaries PCL and the pixel row boundaries PRL. Also, the bank layer 150 may define openings that partially expose the pixel electrodes AE. Parts of the pixel electrodes AE that are not covered, but exposed, by the bank layer 150 may correspond to the light-emitting areas (e.g., LA1, LA2, and LA3), and parts of the pixel electrodes AE that are covered by the bank layer 150 may correspond to the non-light-emitting areas LB. The bank layer 150 may include an organic insulating material.

The organic layer OL may be disposed on the parts of the pixel electrodes AE that are exposed by the openings of the bank layer 150. FIGS. 3 through 9 illustrate that a single organic layer OL is integrally disposed in all the pixels (e.g., PX1, PX2, and PX3). However, the invention is not limited thereto. In another exemplary embodiment, a plurality of organic layers OL may be disposed for the pixels (e.g., PX1, PX2, and PX3), respectively.

The organic layer OL includes organic light-emitting layers. Electrons from the anode electrodes of the OLEDs and holes from the cathode electrodes of the OLEDs may be recombined in the organic light-emitting layers to generate excitons, and in response to the transition of the excitons from an excited state to a ground state, blue light may be emitted. The organic layer OL may further include auxiliary layers helping the injection and movement of holes and electrons.

The common electrode CE may be disposed on the organic layer OL. If the pixel electrodes AE are the anode electrodes of the OLEDs, the common electrode CE may be the cathode electrodes of the OLEDs and may include a low-work-function material that facilitates the injection of electrons, such as, for example, Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg).

Blue light emitted from the organic light-emitting layers which are disposed in the respective pixels (e.g., PX1, PX2, and PX3), may be provided to the respective pixels (e.g., PX1, PX2, and PX3) and may also be provided to neighboring pixels.

The thin-film encapsulation layer 170 may be disposed on the common electrode CE. In order to prevent external impurities or moisture from infiltrating into the organic layer OL, the thin-film encapsulation layer 170 may be disposed on the common electrode CE to seal the organic layer OL. The thin-film encapsulation layer 170 may include first and second encapsulation inorganic films 171 and 173 which include an inorganic material, and an encapsulation organic film 172 which is disposed between the first and second encapsulation inorganic films 171 and 173 and includes an organic material.

The light converter 300 will hereinafter be described. The light converter 300 may include a second base substrate 310, the first light-shielding pattern 320, color filters 330, light conversion patterns (e.g., 351, 352, and 353), a plurality of capping layers 340 that are stacked, and the second light-shielding pattern 360.

The second base substrate 310 faces the first base substrate 110. The second base substrate 310 may include at least one of the aforementioned exemplary materials of the first base substrate 110.

The first light-shielding pattern 320 may be disposed on a first surface of the second base substrate 310 that faces the light provider 100 (i.e., a surface of the second base substrate 310 that is directed to a downward axis of FIG. 5). The first light-shielding pattern 320 may have a lattice shape disposed along the pixel column boundaries PCL and the pixel row boundaries PRL.

The first light-shielding pattern 320 may block the transmission of light. Specifically, the first light-shielding pattern 320 can prevent the mixing of the colors of beams of light emitted from the pixels (e.g., PX1, PX2, and PX3) toward the display surface of the display device 1. That is, the first light-shielding pattern 320 can prevent light incident from light conversion patterns of adjacent pixels. In an exemplary embodiment, the first light-shielding pattern 320 may include at least one of an opaque organic material, a Cr-based metal material, and carbon black.

The color filters 330 may be disposed on the first surface of the second base substrate 310. The color filters 330 may be disposed on the first light-shielding pattern 320. The color filters 330 may be absorptive filters that absorb light of a predetermined wavelength while transmitting light of another predetermined wavelength therethrough.

The color filters 330 may include first, second, and third color filters 331, 332, and 333.

A first wavelength conversion pattern 351 emits blue light L1 and green light L2, and the first color filter 331 may block or absorb the blue light L1 emitted by the first wavelength conversion pattern 351. That is, the first color filter 331 may serve as a blue light blocking filter which blocks blue light and may also serve as a filter selectively transmitting the green light L2 emitted by the first wavelength conversion pattern 351 therethrough. The first color filter 331 may include a green colorant.

A light-transmitting pattern 352 may transmit the blue light L1 as it is therethrough, and the second color filter 332 may transmit the blue light L1 emitted by the light-transmitting pattern 352 The second color filter 332 may include a blue colorant.

A second wavelength conversion pattern 353 emits blue light L1 and red light L3. The third color filter 333 may block or absorb the blue light L1 emitted by the second wavelength conversion pattern 353. That is, the third color filter 333 may serve as a blue light blocking filter which blocks blue light and may also serve as a filter selectively transmitting the red light L3 emitted by the second wavelength conversion pattern 353 therethrough. The third color filter 333 may include a red colorant.

The color filters 330 may be arranged in a stripe fashion. The color filters 330 may be integrally connected to one another along each pixel column and may be disposed across the pixel column boundaries PCL even in the area of the protruding pattern part(s) and/or the indentation pattern part(s) regardless of the presence of the protruding pattern part(s) and/or the indentation pattern part(s) of each of the pixels (e.g., PX1, PX2, and PX3). That is, the first color filter 331 may be generally disposed within the first pixel column, but not on the protruding pattern parts of the first pixel PX1, the second color filter 332 may be generally disposed in the second pixel column and even in the protruding pattern parts of the first and third pixels PX1 and PX3, which are adjacent to the second pixel PX2, and the third color filter 333 may be generally disposed within the third pixel column, but not on the protruding pattern parts of the third pixel PX3.

A pair of adjacent color filters 330 may partially overlap with each other, but the present disclosure is not limited thereto. In an alternative exemplary embodiment, a pair of adjacent color filters 330 may be spaced apart from each other, instead of overlapping with each other.

A first capping layer 341 may be disposed on the color filters 330. The first capping layer 341 may be disposed on the entire surfaces of the color filters 330.

The first capping layer 341 may prevent external impurities such as moisture and air from infiltrating into, and thereby damaging or polluting, the color filters 330. The first capping layer 341 may include an inorganic material. In an exemplary embodiment, for example, the first capping layer 341 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The light conversion patterns (e.g., 351, 352, and 353) may be disposed on the first capping layer 341. The light conversion patterns (e.g., 351, 352, and 353) may include the first wavelength conversion pattern 351, a light-transmitting pattern 352, and the second wavelength conversion pattern 353.

The first wavelength conversion pattern 351 may convert blue light L1 into green light L2 and may emit the green light L2, the second wavelength conversion pattern 353 may convert blue light L1 into red light and may emit the red light L3, and the light-transmitting pattern 352 may transmit therethrough blue light L1 as it is.

Referring to FIG. 6, the first wavelength conversion pattern 351 may include a first base resin and first wavelength conversion particles CCP1 dispersed in the first base resin, the second wavelength conversion pattern 353 may include a second base resin and second wavelength conversion particles CCP2 dispersed in the second base resin, and the light-transmitting pattern 352 may include a third base resin. Each of the light conversion patterns 351, 352, and 353 may further include scattering particles SP dispersed in the first, second, or third base resin.

In an exemplary embodiment, the scattering particles SP may be particles of a metal oxide such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$) or particles of an organic material such as an acrylic resin or a urethane resin.

The materials of the first, second, and third base resins are not particularly limited as long as they have excellent dispersion characteristics for the first or second wavelength conversion particles CCP1 or CCP2 and for the scattering particles SP. In an exemplary embodiment, for example, each of the first, second, and third base resins may include an organic material such as an epoxy resin, an acrylic resin, a cardo resin and an imide resin.

The first wavelength conversion particles CCP1 may convert blue light L1 into green light L2, and the second wavelength conversion particles CCP2 may convert blue light L1 into red light L3. Examples of the first wavelength conversion particles CCP1 and the second wavelength conversion particles CCP2 include quantum dots, quantum rods, or phosphors. For example, the quantum dots are a particulate material emitting light of a particular color in response to the transition of the energy band of their electrons from the conduction band to the valence band. In a case where the first wavelength conversion particles CCP1 and the second wavelength conversion particles CCP2 are both quantum dots, the diameter of the second wavelength conversion particles CCP2 may be greater than the diameter of the first wavelength conversion particles CCP1.

The quantum dots may be a semiconductor nanocrystal material. The quantum dots may have a particular band gap depending on their composition or size. The quantum dots may absorb light and may then emit light of a unique wavelength. Examples of the semiconductor nanocrystal material include a group IV nanocrystal material, a group II-VI compound nanocrystal material, a group III-V compound nanocrystal material, a group IV-VI nanocrystal material, and a combination thereof. Each of the quantum dots may have a core-shell structure consisting of a core including the aforementioned nanocrystal material and a shell surrounding the core.

The light conversion patterns 351, 352, and 353 may be arranged in a stripe fashion. The first wavelength conversion pattern 351, the light-transmitting pattern 352, and the second wavelength conversion pattern 353 may be disposed along the pixel columns and may be connected into one integral body. That is, the first wavelength conversion pattern 351 may be disposed in the first pixel column, the light-transmitting pattern 352 may be disposed in the second pixel column, and the second wavelength conversion pattern 353 may be disposed in the third pixel column. That is, the light conversion patterns 351, 352, and 353 may extend straight regardless of the pixel row boundaries PRL, which are arranged in the axis of the pixel columns.

Referring to FIG. 4, each of the light conversion patterns 351, 352, and 353 may generally have a linear shape extending substantially along the axis of the pixel columns and may include a protruding pattern part and/or an indentation pattern part. The protruding pattern parts and/or the indentation pattern parts of the light conversion patterns 351, 352, and 353 may be disposed along the pixel row boundaries PRL in the non-light-emitting areas LB of the pixels (e.g., PX1, PX2, and PX3). The provision of protruding pattern parts and/or indentation pattern parts in the light conversion patterns 351, 352, and 353 may be determined based on the light extraction efficiency of the light conversion patterns 351, 352, and 353. For example, a light conversion pattern having a relatively low light extraction efficiency may be configured to have protruding pattern parts on both sides thereof, thereby enhancing the light extraction efficiency of the light conversion pattern.

For example, the first wavelength conversion pattern 351 may include a first main pattern part 351*a*, which extends in the axis of the pixel columns, i.e., in the second axis DR2, and may further include, near its corresponding pixel row boundary PRL, first and second protruding pattern parts 351*b* and 351*c*, which protrude from the first main pattern part 351a in the first axis DR1, as illustrated in FIG. 4. The first main pattern part 351a may be a part of the first wavelength conversion pattern 351 extending in the second axis DR2 to have a uniform width in the first axis DR1, as illustrated in FIG. 4. In a plan view, the first main pattern part 351a may include first and second pattern extension lines (or first and second edges) PEL1 and PEL2 of the first wavelength conversion pattern 351 that extend in the second axis DR2. The first and second protruding pattern parts 351b and 351c may protrude outward from the first and second pattern extension lines PEL1 and PEL2, respectively, in the first axis DR1. That is, the first protruding pattern part 351b, the second protruding pattern part 351c, and the first main pattern part 351a may be connected by the first and second pattern extension lines PEL1 and PEL2 of the first wavelength conversion pattern 351.

The first and second protruding pattern parts 351b and 351c may overlap with the first light-shielding pattern 320 and the first color filter 331, which are disposed above the first and second protruding pattern parts 351b and 351c, in the thickness axis (i.e., the third axis DR3). The first protruding pattern part 351b may overlap, in the thickness axis, with a part of the third color filter 333 adjacent to the first color filter 331, and the second protruding pattern part 351c may overlap, in the thickness axis, with a part of the second color filter 332, which is adjacent to the first color filter 331.

The first protruding pattern part 351b may protrude from the first main pattern part 351a toward the first direction of the first axis DR1 (i.e., toward a second wavelength conversion pattern 353 adjacent to the first wavelength conversion pattern 351), and the second protruding pattern part 351c may protrude from the first main pattern part 351a toward a second direction of the first axis DR1 (i.e., in an axis toward the light-transmitting pattern 352). The first and second protruding pattern parts 351b and 351c may be aligned with each other in the first axis DR1, but the present disclosure is not limited thereto.

Since the first wavelength conversion pattern 351 includes the first and second protruding pattern parts 351b and 351c, the area of the first wavelength conversion pattern 351 can be expanded in the non-light-emitting areas LB. As a result, the light conversion efficiency of the first wavelength conversion pattern 351 can be generally improved. That is, as illustrated in FIG. 8, the first protruding pattern part 351b is disposed to overlap with the first light-shielding pattern 320, which is disposed above the first protruding pattern part 351b, but incident light L1 (e.g., blue light) incident upon the first protruding pattern part 351b may be converted into light L2 (e.g., green light) by the first wavelength conversion particles CCPL1 and may then be emitted diagonally upwardly to a first light-outputting area PA1 where the first light-shielding pattern 320 is not disposed. In other words, not only the first main pattern part 351a which is not covered by the first light-shielding pattern 320, but also the first and second protruding pattern parts 351b and 351c, can contribute to increase the amount of light wavelength-converted by the first wavelength conversion pattern 351, and as a result, the light extraction efficiency of the first wavelength conversion pattern 351 can be improved.

A width W351b, in the first axis DR1, of the first wavelength conversion pattern 351 in the non-light-emitting area LB may be greater than a width W351a, in the first axis DR1, of the first main pattern part 351a. The first protruding pattern parts 351b and the second protruding pattern part 351c may be disposed on the outside of imaginary extension, in the axis of the pixel columns, of the second pattern extension line PEL2 of the third pixel PX3 and the first pattern extension line PEL1 of the second pixel PX2 respectively, but the present disclosure is not limited thereto. Alternatively, the first and second protruding pattern parts 351b and 351c may be disposed on the inside of the imaginary extension, in the axis of the pixel columns, of the second pattern extension line PEL2 of the third pixel PX3 and the first pattern extension line PEL1 of the second pixel PX2 respectively.

The first and second protruding pattern parts 351b and 351c may have the same width along the first axis DR1, but the present disclosure is not limited thereto.

The light-transmitting pattern 352 may include a second main pattern part 352a, which extends substantially in the axis of the pixel columns, i.e., in the second axis DR2. The light-transmitting pattern 352 may further include, near its corresponding pixel row boundary PRL, first and second indentation pattern parts IDP1 and IDP2, which are recessed from the second main pattern part 352a in the first axis DR1.

The second main pattern part 352a may be a part of the light-transmitting pattern 352 extending in the second axis DR2 to have a uniform width in the first axis DR1, as illustrated in FIG. 4. In a plan view, the second main pattern part 352a may overlap with, or may be disposed on the inside of, first and second extension lines PEL1 and PEL2 of the light-transmitting pattern 352 that extend in the second axis DR2. That is, both edges of the second main pattern part 352a may extend in the second axis DR2 along the first and second pattern extension lines PEL1 and PEL2 of the light-transmitting pattern 352 and may include the first and second indentation pattern parts IDP1 and IDP2, which are recessed inwardly from the first and second pattern extension lines PEL1 and PEL2, respectively, of the light-transmitting pattern 352.

Specifically, the first indentation pattern part IDP1 may be recessed from the first pattern extension line PEL1 of the light-transmitting pattern 352 toward the second direction of the first axis DR1 (i.e., in a direction away from the first wavelength conversion pattern 351), and the second indentation pattern part IDP2 may be recessed in a direction from the second pattern extension line PEL2 of the light-transmitting pattern 352 toward the first direction of the first axis DR1 (i.e., in a direction away from the second wavelength conversion pattern 353).

The first and second indentation pattern parts IDP1 and IDP2 may be aligned with each other in the first axis DR1, but the present disclosure is not limited thereto.

The first and second indentation pattern parts IDP1 and IDP2 may overlap with the first light-shielding pattern 320 and the second color filter 332, which are disposed above the first and second indentation pattern parts IDP1 and IDP2, in the thickness axis (i.e., the third axis DR3). The first and second indentation pattern parts IDP1 and IDP2, unlike the first and second protruding pattern parts 351b and 351c, may not overlap with the first and third color filters 331 and 333 in the thickness axis.

A width W352b, in the first axis DR1, of a part of the light-transmitting pattern 352 where the first and second indentation pattern parts IDP1 and IDP2 are disposed may be smaller than a width W352a, in the first axis, of a part of the light-transmitting pattern 352 where the first and second indentation pattern parts IDP1 and IDP2 are not disposed. The width from the first pattern extension line PEL1 of the light-transmitting pattern 352 to the first indentation pattern part IDP1 in the first axis DR 1 may be determined by the width of the second protruding pattern part 351c of the first wavelength conversion pattern 351, and the width from the second pattern extension line PEL2 of the light-transmitting pattern 352 to the second indentation pattern part IDP2 in the first axis DR 1 may be determined by the width of a third protruding pattern part 353b of the second wavelength conversion pattern 353. For example, the width from the first pattern extension line PEL1 of the light-transmitting pattern 352 to the first indentation pattern part IDP1 may be the same as the width of the second protruding pattern part 351c of the first wavelength conversion pattern 351, and the width from the second pattern extension line PEL2 of the light-transmitting pattern 352 to the second indentation pattern part IDP2 may be the same as the width of the third protruding pattern part 353b of the second wavelength conversion pattern 353. However, the present disclosure is not limited to this example. In another exemplary embodiment, the width from the first pattern extension line PEL1 of the light-transmitting pattern 352 to the first indentation pattern part IDP1 may be smaller than the width of the second protruding pattern part 351c of the first wavelength conversion pattern 351, and the width from the second pattern extension line PEL2 of the light-transmitting pattern 352 to the second indentation pattern part IDP2 may be smaller than the width of the third protruding pattern part 353b of the second wavelength conversion pattern 353.

The width from the first pattern extension line PEL1 of the light-transmitting pattern 352 to the first indentation pattern part IDP1 may be the same as the width from the second pattern extension line PEL2 of the light-transmitting pattern 352 to the second indentation pattern part IDP2, but the present disclosure is not limited thereto.

In some exemplary embodiments, the light-transmitting pattern 352 may not include the first and second indentation pattern parts IDP1 and IDP2 and may be formed in a linear shape extending along the second axis DR2. That is, the second main pattern part 352a of the light-transmitting pattern 352 may extend straightly along the first and second pattern extension lines PEL1 and PEL2 of the light-transmitting pattern 352.

The second wavelength conversion pattern 353 may include a third main pattern part 353a, which extends in the axis of the pixel columns (i.e., in the second axis DR2), and may further include, near its corresponding pixel row boundary PRL, the third protruding pattern part 353b, which protrudes toward the outside of the third pixel PX3 along the first axis DR1, and a third indentation pattern part IDP3, which is recessed toward the inside of the third pixel PX3 along the first axis DR1.

The third main pattern part 353a may be a part of the second wavelength conversion pattern 353 extending in the second axis DR2 to have a uniform width in the first axis DR1, as illustrated in FIG. 4. In a plan view, the third main pattern part 353a may overlap with, or may be disposed on the inside of, first and second extension lines PEL1 and PEL2 of the second wavelength conversion pattern 353 that extend in the second axis DR2. The third protruding pattern part 353b may be a part of the second wavelength conversion pattern 353 that protrudes from the left side of the first pattern extension line PEL1 of the third main pattern part 353a toward the light-transmitting pattern 352. That is, the third protruding pattern part 353b and the third main pattern part 353a may be connected by the first pattern extension line PEL1 of the third main pattern part 353a.

An edge of the third main pattern part 353a that is adjacent to a first wavelength conversion pattern 351 adjacent to the second wavelength conversion pattern 353 may extend in the second axis DR2 along the second pattern extension line PEL2 of the second wavelength conversion pattern 353 and may include, near its corresponding pixel row boundary PRL, the third indentation pattern part IDP3, which is recessed inwardly from the second pattern extension line PEL2 of the second wavelength conversion pattern 353.

That is, the third protruding pattern part 353b may protrude from the third main pattern part 353a toward the first direction of the first axis DR1 (i.e., in a direction toward the light-transmitting pattern 352), and the third indentation pattern part IDP3 may be recessed toward the first direction of the first axis DR1 (i.e., in a direction away from the first wavelength conversion pattern 351 adjacent to the second wavelength conversion pattern 353).

The third protruding pattern part 353b may overlap with the first light-shielding pattern 320 and the third color filter 333, which are disposed above the third protruding pattern part 353b, in the thickness axis (i.e., the third axis DR3). Also, the third protruding pattern part 353b may overlap with a part of the second color filter 332, which is adjacent to the third color filter 333, in the thickness axis.

Since the second wavelength conversion pattern 353 includes the third protruding pattern part 353b and the third indentation pattern part IDP3, the second wavelength conversion pattern 353 may have an expanded area on one side thereof and a reduced area on the other side thereof. The third protruding pattern part 353b is disposed to overlap with the first light-shielding pattern 320, which is disposed above the third protruding pattern part 353b, but incident light L1 (e.g., blue light) incident upon the third protruding pattern part 353b may be converted into light L2 (e.g., red light) by the second wavelength conversion particles CCPL2 and may then be emitted diagonally upwardly to a third light-outputting area PA3 where the first light-shielding pattern 320 is not disposed. In other words, not only the third main pattern part 353a which is not covered by the first light-shielding pattern 320, but also the third protruding pattern part 353b, can contribute to increase the amount of light wavelength-converted by the second wavelength conversion pattern 353. Accordingly, any reduction in the amount of light wavelength-converted by the second wavelength conversion pattern 353 at the third indentation pattern part IDP3 can be compensated for.

The width, in the first axis DR1, of a part of the second wavelength conversion pattern 353 where the third protruding pattern part 353b and the third indentation pattern part IDP3 are disposed may be the same as the width, in the first axis DR1, of a part of the second wavelength conversion pattern 353 where only the third main pattern part 353a is disposed. That is, the width, in the first axis DR1, of the third protruding pattern part 353b may be the same as the width of the third indentation pattern part IDP3 from a reference line of the third main pattern part 353a. In some exemplary embodiments, the width, in the first axis DR1, of the third protruding pattern part 353b may be greater than the width of the third indentation pattern part IDP3 from the reference line of the third main pattern part 353a, in which case, the light extraction efficiency of the second wavelength conversion pattern 353 can be generally improved.

The third protruding pattern part 353b may be disposed on the outside of imaginary extension, in the axis of the pixel columns, of the second pattern extension line PEL2 of the second pixel PX2, but the present disclosure is not limited thereto. Alternatively, the third protruding pattern part 353b may be disposed on the inside of the imaginary extension, in the axis of the pixel columns, of the second pattern extension line PEL2 of the second pixel PX2. axis In a plan view, the light conversion patterns 351, 352, and 353 may be disposed in the pixels PX1, PX2, and PX3, respectively. That is, in a plan view, each of the size of the light conversion patterns 351, 352, and 353 may be smaller than the size of the corresponding pixel of the pixels PX1, PX2, and PX3, respectively. Accordingly, the light conversion patterns 351, 352, and 353 may be spaced apart from one another by the pixel column boundaries PCL.

A second capping layer 342 may be disposed on the light conversion patterns 351, 352, and 353. The second capping layer 342 may cover the light conversion patterns 351, 352, and 353.

The second capping layer 342 may include an inorganic material. The second capping layer 342 may include the same material as the first capping layer 341 and may include one material selected from among the aforementioned exemplary materials of the first capping layer 341.

The second light-shielding pattern 360 may be disposed on the second capping layer 342.

The second light-shielding pattern 360 may prevent the mixing of colors between the pixels (e.g., PX1, PX2, and PX3). The second light-shielding pattern 360 may include at least one of the aforementioned exemplary materials of the first light-shielding pattern 320. For example, the second light-shielding pattern 360 may include an opaque organic material.

The second light-shielding pattern 360, like the light conversion patterns 351, 352, and 353, may include a stripe pattern. That is, the second light-shielding pattern 360 may be integrally disposed over pixels along the pixel column boundaries PCL.

The second light-shielding pattern 360 may overlap with the first light-shielding pattern 320 in the thickness axis. The second light-shielding pattern 360 may overlap with the first light-shielding pattern 320 at the pixel column boundaries PCL. In a plan view, the width of the second light-shielding pattern 360 may be the same as the width of the first light-shielding pattern 320. In some exemplary embodiments, in a plan view, the width of the second light-shielding pattern 360 may be greater than the width of the first light-shielding pattern 320.

The second light-shielding pattern 360 may be disposed between the light conversion patterns 351, 352, and 353 to fill the gaps between the light conversion patterns 351, 352, and 353. Also, as illustrated in FIG. 6, the second light-shielding pattern 360 may extend even over to the surfaces of the light conversion patterns 351, 352, and 353.

The filler member 70 may be disposed between the light provider 100 and the light converter 300. The filler member 70 may be in direct contact with the thin-film encapsulation layer 170 of the light provider 100 and with the second capping layer 342 and the second light-shielding pattern 360 of the light converter 300.

The filler member 70 may planarize height differences generated by the light conversion patterns 351, 352, and 353 and the second light-shielding pattern 360. The filler member 70 may include a material having a buffer function and may thus serve as a buffer member capable of absorbing an impact that may be generated between the light provider 100 and the light converter 300. In an exemplary embodiment, for example, the filler member 70 may include a silicon-based organic material, an epoxy-based organic material, an acrylic organic material, or the like, but the present disclosure is not limited thereto.

Referring to FIGS. 8 and 9, light L1 (e.g., blue light) emitted by the organic layer OL may be incident upon the first protruding pattern part 351b, which includes the first wavelength conversion particles CCPL1 and the scattering particles SP. The light L1 may be scattered by the scattering particles SP and may then be incident upon the first color filter 331 to be absorbed (i.e., L11) or to travel to the first wavelength conversion particles CCPL1 (i.e., L12). Scattered light L12 from the first wavelength conversion particles CCPL1 may be wavelength-converted by the first wavelength conversion particles CCPL1.

Light L1 incident upon the first wavelength conversion particles CCPL1 may be wavelength-converted by the first wavelength conversion particles CCPL1, thereby obtaining light (e.g., L21 and L22). Some of the light L22 may be absorbed by the first light-shielding pattern 320, but some of the light L22 may be reflected by the first light-shielding pattern 320 to travel to areas where the first light-shielding pattern 320 is not disposed (i.e., the first and third light-outputting areas PA1, PA2, and PA3), or to travel back to the first wavelength conversion patterns 351. Some of the light wavelength-converted by the first wavelength conversion particles CCPL1 (i.e., light L21) may travel in a diagonally upward axis to be emitted to the areas where the first light-shielding pattern 320 is not disposed (i.e., the first and third light-outputting areas PA1 and PA3). Since at least some wavelength-converted light obtained from the incident light L1 by the first or second wavelength conversion particles CCPL1 or CCPL2 is emitted to the first and third light-outputting areas PA1 and PA3, the general light efficiency of the display device 1 can be improved by the first wavelength conversion pattern 351 or can be improved, or at least maintained, by the second wavelength conversion pattern 353.

Display devices according to other exemplary embodiments of the present disclosure will hereinafter be described. In the accompanying drawings, like reference numerals indicate like elements, and thus, descriptions thereof will be omitted or at least simplified.

Figure 10:
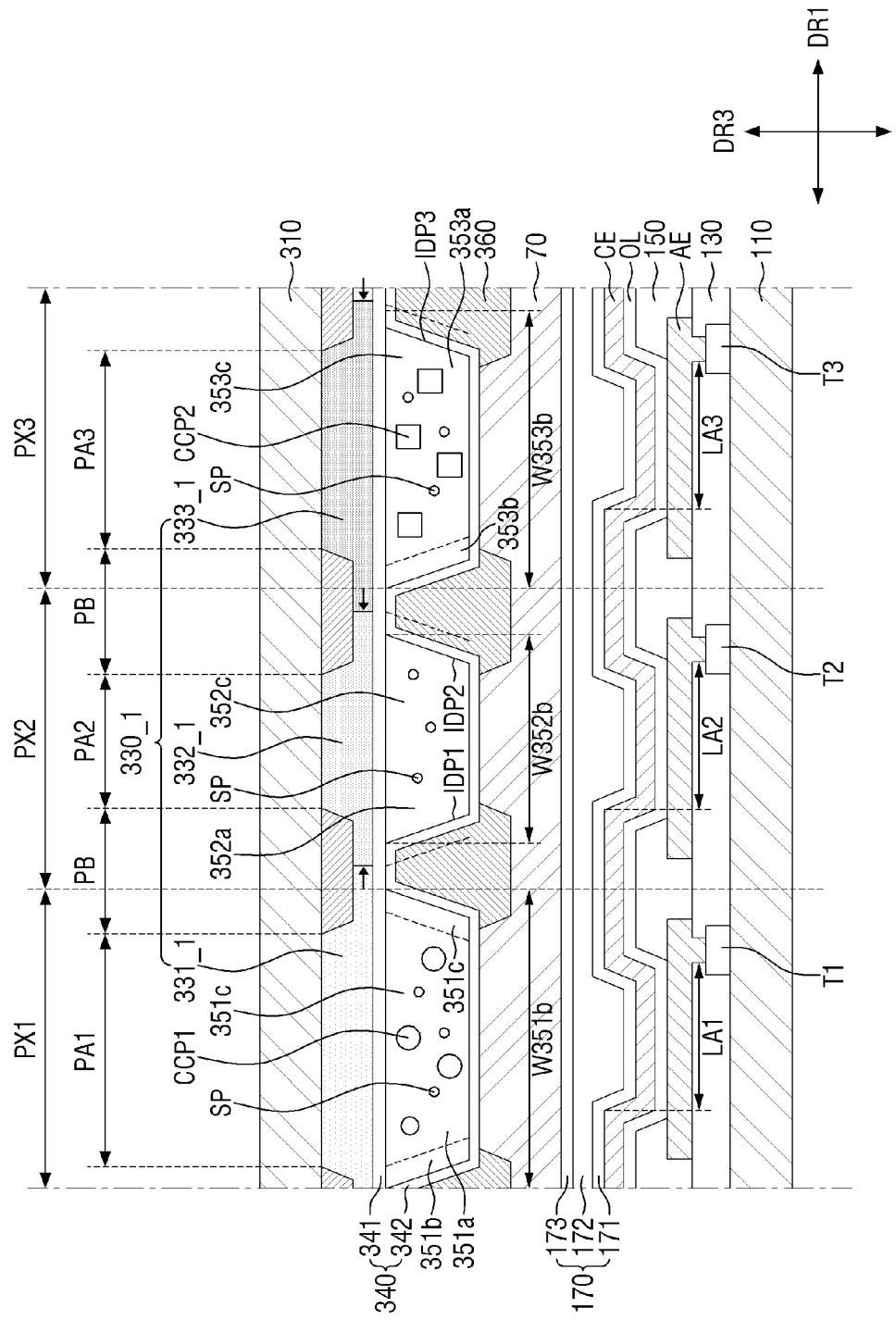
FIG. 10 is a cross-sectional view of another exemplary embodiment of a display device according to the present disclosure.

FIG. 10 is a cross-sectional view of a display device according to another exemplary embodiment of the present disclosure.

Referring to FIG. 10, a display device 2 includes color filters 330_1, and the color filters 330_1 differ from the color filters 330 of FIGS. 3 through 6 in that they are disposed in pixels (e.g., PX1, PX2, and PX3).

Specifically, the color filters 330_1 may be disposed in the pixels (e.g., PX1, PX2, and PX3) and may overlap with light conversion patterns 351, 352, and 353, which are disposed below the color filters 330_1, in a thickness axis (i.e., the third axis DR3). That is, first and second protruding pattern parts 351b and 351c of a first wavelength conversion pattern 351 may overlap with a first color filter 331_1, which is disposed above the first wavelength conversion pattern 351, but not with second and third color filters 332_1 and 333_1, and a third protruding pattern part 353b of a second wavelength conversion pattern 353 may overlap with a third color filter 333_1, which is disposed above the second wavelength conversion pattern 353, but not with the second color filter 332_1.

In the exemplary embodiment of FIG. 10, like in the exemplary embodiment of FIGS. 3 through 6, light L1 incident upon the first, second, and third protruding pattern parts 351b, 351c, and 353b is wavelength-converted by first or second wavelength conversion particles CCPL1 and CCPL2 and some of the wavelength-converted light is emitted to a first or third light-output area PA1 or PA3. Accordingly, the general light efficiency of the display device 2 can be improved by the first wavelength conversion pattern 351 or can be improved, or at least maintained, by the second wavelength conversion pattern 353.

FIG. 11 is a plan view of still another exemplary embodiment of a display device according to the present disclosure.

Referring to FIG. 11, a light-transmitting pattern 352_1 and a second wavelength conversion pattern 353_1 differ from the light-transmitting pattern 352 and the second wavelength conversion pattern 353, respectively, of FIGS. 4 through 8.

Specifically, the light-transmitting pattern 352_1 may not include a second indentation pattern part IDP2, and a short side, on a second direction of a first axis DR1, of the light-transmitting pattern 352_1 may have a linear shape extending in a second axis DR2 in a plan view. The second wavelength conversion pattern 353_1 may not include a third protruding pattern part 353b, and a short side, on a first direction of the first axis DR1, of the second wavelength conversion pattern 353_1 may have a linear shape extending in the second axis DR2 in a plan view. The right side of the light-transmitting pattern 352_1 that faces the second wavelength conversion pattern 353_1 and the left side of the second wavelength conversion pattern 353_1 that faces the light-transmitting pattern 352_1 may extend opposite to each other as illustrated in FIG. 11.

A width W352b_1, in the first axis DR1, of a part of the light-transmitting pattern 352_1 where a first indentation pattern part IDP1 is disposed may be smaller than a width W352a, in the first axis DR1, of a part of the light-transmitting pattern 352_1 where the first indentation pattern part IDP1 is not disposed.

A width W353b_1, in the first axis DR1, of a part of the second wavelength conversion pattern 353_1 where a third indentation pattern part IDP3 are disposed may be smaller than a width W353a, in the first axis DR1, of a part of the second wavelength conversion pattern 353_1 where only the third main pattern part 353a is disposed.

According to the exemplary embodiment of FIG. 11, a reduction in the amount of light (e.g., blue light) emitted through the light-transmitting pattern 352_1 of a second pixel PX2 can be prevented. In the exemplary embodiment of FIG. 11, like in the exemplary embodiment of FIGS. 3 through 6, light L1 incident upon first and second protruding pattern parts 351b and 351c of a first wavelength conversion pattern 351 is wavelength-converted by first wavelength conversion particles CCPL1 and some of the wavelength-converted light is emitted to a first light-output area PA1. Accordingly, the general light efficiency of a display device 3 can be improved by the first wavelength conversion pattern 351.

FIG. 12 is a plan view of still another exemplary embodiment of a display device according to the present disclosure.

Referring to FIG. 12, first and second wavelength conversion patterns 351_1 and 353_2 differ from the first and second wavelength conversion patterns 352 and 353, respectively, of FIGS. 4 through 8.

Specifically, the first wavelength conversion pattern 351_1 may not include a protruding pattern part projected toward its neighboring second wavelength conversion pattern 353_2. The second wavelength conversion pattern 353_2 may not include an indentation pattern part, and a short side, on a second direction of a first axis DR1, of the second wavelength conversion pattern 353_2 may have a linear shape extending in a second axis DR2 in a plan view. A left side of the first wavelength conversion pattern 351_1 that faces the second wavelength conversion pattern 353_2 and a right side of the second wavelength conversion pattern 353_2 that faces the first wavelength conversion pattern 351_1 may extend opposite to each other as illustrated in FIG. 12.

In the exemplary embodiment of FIG. 12, light incident upon the second protruding pattern part 351c of the first wavelength conversion pattern 351_1 and upon the third protruding pattern part 353b of the second light conversion pattern 353_2 is wavelength-converted by first or second wavelength conversion particles CCPL1 or CCPL2 respectively and some of the wavelength-converted light is emitted to a first or third light-output area PA1 or PA3. Accordingly, the general light efficiency of a display device 4 can be improved by the first and second wavelength conversion patterns 351_1 and 353_2.

Figure 13:
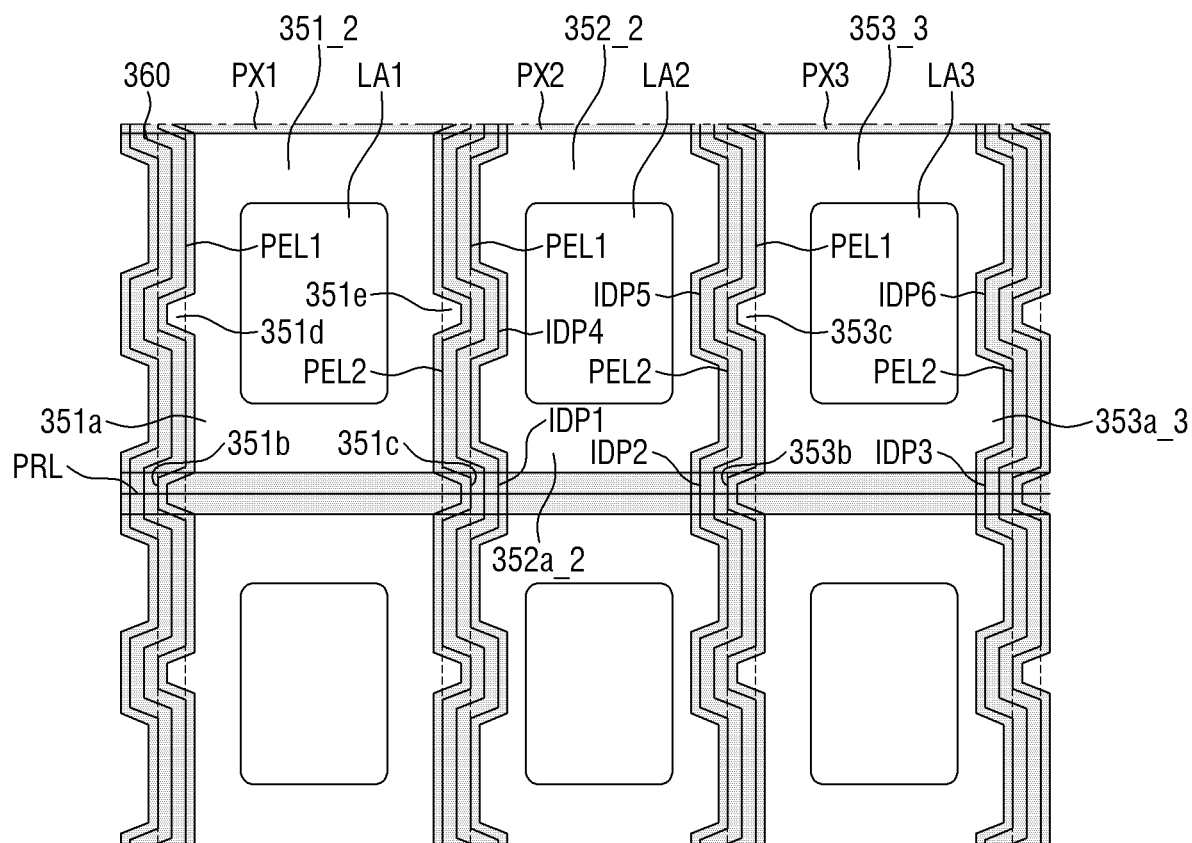
FIG. 13 is a plan view of still another exemplary embodiment of a display device according to the present disclosure.

FIG. 13 is a plan view of still another exemplary embodiment of a display device according to the present disclosure.

Referring to FIG. 13, a first wavelength conversion pattern 351_2, a light-transmitting pattern 352_2, and a second wavelength conversion pattern 353_3 differ from the first wavelength conversion pattern 351, the light-transmitting pattern 352, and the second wavelength conversion pattern 353, respectively, of FIG. 4 in that they further include one or more protruding pattern parts and/or one or more indentation pattern parts in an area that overlaps with a pixel column boundary PCL, for example, in an area that overlaps with a row of first, second, and third light-emitting areas LA1, LA2, and LA3 of first, second, and third pixels PX1, PX2, and PX3 in a first axis DR1.

Specifically, the first wavelength conversion pattern 351_2 may include, in an area that does not overlap with a pixel row boundary PRL, fourth and fifth protruding pattern parts 351d and 351e, which protrude from a first main pattern part 351a in a first axis DR1. The fourth and fifth protruding pattern parts 351d and 351e may be disposed in a non-light-emitting area LB.

The fourth protruding pattern part 351d may protrude from the left side of the first main pattern part 351a toward a first direction of the first axis DR1 (i.e., in a direction toward a second wavelength conversion pattern 353_3 adjacent to the first wavelength conversion pattern 351_2), and the fifth protruding pattern part 351e may protrude from the right side of the first main pattern part 351a toward a second direction of the first axis DR1 (i.e., in a direction toward the light-transmitting pattern 352_2). The fourth and fifth protruding pattern parts 351d and 351e may be aligned with each other in the first axis DR1, but the present disclosure is not limited thereto.

The fourth and fifth protruding pattern parts 351d and 351e may be disposed on the outside of imaginary extension, in the axis of the pixel columns, of the second pattern extension line PEL2 of the third pixel PX3 and the first pattern extension line PEL1 of the second pixel PX2 respectively, but the present disclosure is not limited thereto. Alternatively, the fourth and fifth protruding pattern parts 351d and 351e may be disposed on the inside of the imaginary extension, in the axis of the pixel columns, of the second pattern extension line PEL2 of the third pixel PX3 and the first pattern extension line PEL1 of the second pixel PX2 respectively.

The fourth and fifth protruding pattern parts 351d and 351e may have the same width, but the present disclosure is not limited thereto. The fourth and fifth protruding pattern parts 351d and 351e may have the same width as first and second protruding pattern parts 351b and 351c, but the present disclosure is not limited thereto.

The fourth and fifth protruding pattern parts 351d and 351e may overlap with a first light-shielding pattern 320 and a first color filter 331, which are disposed above the first wavelength conversion pattern 351, in a thickness axis (i.e., the third axis DR3). That is, the fourth protruding pattern part 351*d* may overlap, in the thickness axis, with a part of a third color filter 333 adjacent to the first color filter 331, and the fifth protruding pattern part 351*e* may overlap, in the thickness axis, with a part of a second color filter 332 adjacent to the first color filter 331.

Since the first wavelength conversion pattern 351_2 includes not only the first and second protruding pattern parts 351*b* and 351*c*, but also the fourth and fifth protruding pattern parts 351*d* and 351*e*, and can thus be further expanded into the non-light-emitting area LB, the wavelength conversion efficiency of the first wavelength conversion pattern 351_2 can be generally improved.

The width, in the first axis DR1, of a part of the first wavelength conversion pattern 351_2 where the first main pattern part 351*a* and the fourth and fifth protruding pattern parts 351*d* and 351*e* are all disposed may be greater than the width, in the first axis DR1, of a part of the first wavelength conversion pattern 351_2 where only the first main pattern part 351*a* is disposed.

A second main pattern part 352*a*_2 of the light-transmitting pattern 352_2 may further include, in an area that does not overlap with the pixel row boundary PRL, fourth and fifth indentation pattern parts IDP4 and IDP5, which are recessed in the first axis DR1. The fourth indentation pattern part IDP4 may be recessed toward the second direction of the first axis DR1 (i.e., in a direction away from the first wavelength conversion pattern 351_2), and the fifth indentation pattern part IDP5 may be recessed toward the first direction of the first axis DR1 (i.e., in a direction away from the second wavelength conversion pattern 353_3).

The fourth and fifth indentation pattern parts IDP4 and IDP5 may be aligned with each other in the first axis DR1, but the present disclosure is not limited thereto.

The fourth and fifth indentation pattern parts IDP4 and IDP5 may overlap with the first light-shielding pattern 320 and the second color filter 332, which are disposed above the fourth and fifth indentation pattern parts IDP4 and IDP5, in the thickness axis (i.e., the third axis DR3).

The width, in the first axis DR1, of a part of the light-transmitting pattern 352_2 where the fourth and fifth indentation pattern parts IDP4 and IDP5 are disposed may be smaller than the width, in the first axis DR1, of a part of the light-transmitting pattern 352_2 where the fourth and fifth indentation pattern parts IDP4 and IDP5 are not disposed. The width to which the second main pattern part 352*a*_1 is recessed on either side thereof may be the same as the width of the fifth protruding pattern part 351*e* or a sixth protruding pattern part 353*c* of the second wavelength conversion pattern 353_3, but the present disclosure is not limited thereto. Alternatively, the width to which the second main pattern part 352*a*_1 is recessed on either side thereof may be smaller than the width of the fifth protruding pattern part 351*e* or the sixth protruding pattern part 353*c*.

The fourth and fifth indentation pattern parts IDP4 and IDP5 may have the same width from their respective sides of the second main pattern part 352*a*_2 that extend in a second axis DR2, but the present disclosure is not limited thereto.

In some exemplary embodiments, the light-transmitting pattern 352_2 may not include the fourth and fifth indentation pattern parts IDP4 and IDP5 and may have a linear shape extending in the second axis DR2.

The second wavelength conversion pattern 353_3 may include, in an area that does not overlap with the pixel row boundary PRL, the sixth protruding pattern part 353*c*, which protrudes from a third main pattern part 353*a*_3 in the first axis DR1, and a sixth indentation pattern part IDP6, which is recessed toward the inside of the third pixel PX3 in the first axis DR1. The sixth protruding pattern part 353*c* may protrude from the left side of the third main pattern part 353*a*_3 toward the first direction of the first axis DR1 (i.e., in a direction toward the light-transmitting pattern 352_2), and the sixth indentation pattern part IDP6 may be recessed toward the first direction of the first axis DR1 (i.e., in a direction away from a first wavelength conversion pattern 351_2 adjacent to the second wavelength conversion pattern 353_3).

The sixth protruding pattern part 353*c* may overlap with the first light-shielding pattern 320 and a third color filter 333, which are disposed above the sixth protruding pattern part 353*c*, in the thickness axis. Also, the sixth protruding pattern part 353*c* may overlap with a part of the second color filter 332 in the thickness axis.

Since the second wavelength conversion pattern 353_3 includes the sixth protruding pattern part 353*c* and the sixth indentation pattern part IDP6, the second wavelength conversion pattern 353_3 may have an expanded area on one side thereof and a reduced area on the other side thereof. The sixth protruding pattern part 353*c* is disposed to overlap with the first light-shielding pattern 320, which is disposed above the sixth protruding pattern part 353*c*, but incident light L1 (e.g., blue light) incident upon the sixth protruding pattern part 353*c* may be converted into light L2 (e.g., red light) by second wavelength conversion particles CCPL2 and may then be emitted diagonally upwardly to a third light-outputting area PA3 where the first light-shielding pattern 320 is not disposed. In other words, not only the third main pattern part 353*a*_3, which is not covered by the first light-shielding pattern 320, but also the sixth protruding pattern part 353*c*, can contribute to increase the amount of light wavelength-converted by the second wavelength conversion pattern 353_3. Accordingly, any reduction in the amount of light wavelength-converted by the second wavelength conversion pattern 353_3 at the sixth indentation pattern part IDP6 can be compensated for.

The width, in the first axis DR1, of a part of the second wavelength conversion pattern 353_3 where the third main pattern part 353*a*_3, the sixth protruding pattern part 353*c*, and the sixth indentation pattern part IDP6 are all disposed may be the same as the width, in the first axis DR1, of a part of the second wavelength conversion pattern 353_3 where only the third main pattern part 353*a*_3 is disposed. That is, the width, in the first axis DR1, of the sixth protruding pattern part 353*c* may be the same as the width of the sixth indentation pattern part IDP6 from a reference line of the third main pattern part 353*a*_3. In some exemplary embodiments, the width, in the first axis DR1, of the sixth protruding pattern part 353*c* may be greater than the width of the sixth indentation pattern part IDP6 from the reference line of the third main pattern part 353*a*_3, in which case, the light extraction efficiency of the second wavelength conversion pattern 353_3 can be generally improved.

The sixth protruding pattern part 353*c* may be disposed on the outside of imaginary extension, in the axis of the pixel columns, of the second pattern extension line PEL2 of the second pixel PX2, but the present disclosure is not limited thereto. Alternatively, the sixth protruding pattern part 353*c* may be disposed on the inside of the imaginary extension, in the axis of the pixel columns, of the second pattern extension line PEL2 of the second pixel PX2. The sixth protruding pattern part 353*c* and the sixth indentation pattern part IDP6 may be aligned with each other in the first axis DR1, but the present disclosure is not limited thereto.

FIG. 14 is a plan view of still another exemplary embodiment of a display device according to the present disclosure.

Referring to FIG. 14, a first wavelength conversion pattern 351_2, a light-transmitting pattern 352_3, and a second wavelength conversion pattern 353_4 differ from the first wavelength conversion pattern 351, the light-transmitting pattern 352_1, and the second wavelength conversion pattern 353_1, respectively, of FIG. 11 in that they further include one or more protruding pattern parts and/or one or more indentation pattern parts in an area that does not overlap with a pixel row boundary PRL.

Specifically, the first light conversion pattern 351_2 may further include, in the area that does not overlap with the pixel row boundary PRL, a fourth protruding pattern part 351d which protrudes toward the second wavelength conversion pattern 353_4, and a fifth protruding pattern part 351e which protrudes toward the light-transmitting pattern 352_3. The light-transmitting pattern 352_3 may further include a fourth indentation pattern part IDP4 which is recessed from a second main pattern part 352a_3 in a direction away from the first wavelength conversion pattern 351_2, and the second wavelength conversion pattern 353_4 may further include a sixth indentation pattern part IDP6, which is recessed from a third main pattern part 353a_4 in a direction away from a first wavelength conversion pattern 351_2 adjacent to the second wavelength conversion pattern 353_4.

The fourth protruding pattern part 351d, the fifth protruding pattern part 351e, the fourth indentation pattern part IDP4, and the sixth indentation pattern part IDP6 are as already described above, and thus, detailed descriptions thereof will be omitted.

FIG. 15 is a plan view of still another exemplary embodiment of a display device according to the present disclosure.

Referring to FIG. 15, a first wavelength conversion pattern 351_3, a light-transmitting pattern 352_4, and a second wavelength conversion pattern 353_5 differ from the first wavelength conversion pattern 351_1, the light-transmitting pattern 352, and the second wavelength conversion pattern 353_2, respectively, of FIG. 12 in that they further include one or more protruding pattern parts and/or one or more indentation pattern parts in an area that does not overlap with a pixel row boundary PRL.

Specifically, the first light conversion pattern 351_3 may further include, in the area that does not overlap with the pixel row boundary PRL, a fifth protruding pattern part 351e, which protrudes toward the light-transmitting pattern 352_4, and the second wavelength conversion pattern 353_5 may further include a sixth protruding pattern part 353c, which protrudes from a third main pattern part 353a_5 toward the light-transmitting pattern 352_4.

The fifth and sixth protruding pattern parts 351e and 353c are as already described above, and thus, detailed descriptions thereof will be omitted.

FIG. 16 is a plan view of still another exemplary embodiment of a display device according to the present disclosure.

Referring to FIG. 16, a display device 8 differs from the display device of FIG. 4 in that light conversion patterns 351, 352, and 353 are disposed, but not at every pixel row boundary PRL. In the exemplary embodiment of FIG. 16, protruding pattern parts and/or indentation pattern parts are disposed at every two pixel row boundaries PRL, but the present disclosure is not limited thereto. Alternatively, the protruding pattern parts and/or the indentation pattern parts may be disposed at every three or more pixel row boundaries PRL.

Although not specifically illustrated, the protruding pattern parts and/or the indentation pattern parts may be disposed non-repeatedly in first, second, and third pixels PX1, PX2, and PX3 in a first axis DR1, but may not be disposed in neighboring first, second, and third pixels PX1, PX2, and PX3, in a second axis DR2, of the first, second, and third pixels PX1, PX2, and PX3.

Figure 17:
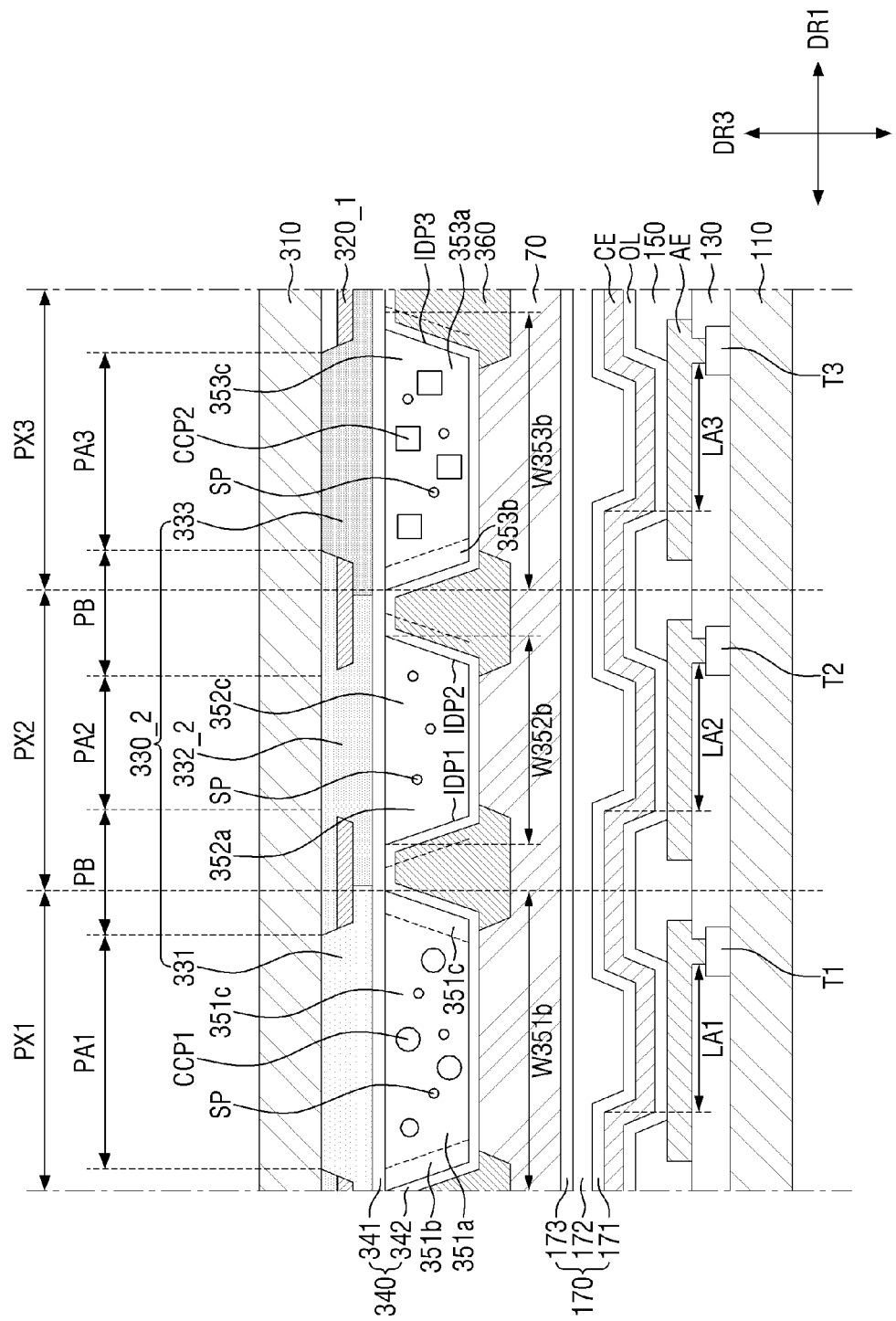
FIG. 17 is a cross-sectional view of still another exemplary embodiment of a display device according to the present disclosure.

FIG. 17 is a cross-sectional view of still another exemplary embodiment of a display device according to the present disclosure.

Referring to FIG. 17, a display device 9 differs from the display device 1 in that color filters 330_2 include second color filters 332_2 disposed between a second base substrate 310 and a first light-shielding pattern 320_1.

Specifically, the second color filters 332_2 may be disposed in first and third pixels PX1 and PX3 to overlap with the first light-shielding pattern 320_1 in a thickness axis and may also be disposed in a second pixel PX2, particularly, between the first light-shielding pattern 320_1 and the second base substrate 310, to cover and contact opposite sides of the first light-shielding pattern 320_1 in the second pixel PX2.

External light incident upon the display device 9 may penetrate the second color filters 332_2 between the second base substrate 310 and the first light-shielding pattern 320_1. That is, the external light penetrating the second color filters 332_2 may be blue light, and may be reflected at the interfaces between the first light-shielding pattern 320_1 and the second color filters 332_2 to be emitted out of the display device 9. The exemplary embodiment of FIG. 17 may be employed when the aperture ratio of the second color filters 332_2 is smaller than the aperture ratios of first and third color filters 331_2 and 333_2.

Although the preferred exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
   a plurality of pixels arranged in a row axis and in a column axis that intersects the row axis;
   a first substrate on which a light-emitting element is disposed in each of the plurality of pixels;
   a second substrate which faces the first substrate; and
   a plurality of light conversion patterns including a first wavelength conversion pattern disposed on the second substrate in a first pixel column and which converts wavelength of light emitted from the light-emitting element,
   wherein the first wavelength conversion pattern includes a first main pattern part arranged in a stripe fashion along the column axis and a protruding pattern part projected from the first main pattern part toward at least one of first and second directions of the row axis.

2. The display device of claim 1, wherein the protruding pattern part is disposed at a pixel row boundary.

3. The display device of claim 1, wherein the protruding pattern part is provided in plural and includes a first protruding pattern part projected from the first main pattern part toward the first direction of the row axis and a second protruding pattern part projected from the first main pattern part toward the second direction of the row axis.

4. The display device of claim 3, further comprising:
   a second pixel column disposed toward the second direction of the row axis from the first pixel column; and a light-transmitting pattern of the plurality of light conversion patterns disposed along the second pixel column and which includes a first indentation pattern part recessed toward the second direction of the row axis along the second protruding pattern part.

5. The display device of claim 4, further comprising:
a third pixel column disposed toward the second direction of the row axis from the second pixel column and which extends in the column axis; and
a second wavelength conversion pattern of the plurality of light conversion patterns which includes a second main pattern part disposed along the third pixel column and a third protruding pattern part projected from the second main pattern part toward the first direction of the row axis.

6. The display device of claim 5, wherein the second wavelength conversion pattern further includes a second indentation pattern part recessed toward the first direction of the row axis along the third protruding pattern part.

7. The display device of claim 6, wherein the first, second, and third pixel columns are repeatedly arranged along the row axis, and
the second wavelength conversion pattern further includes a third indentation pattern part recessed toward the first direction of the row axis along the first protruding pattern part of the first wavelength conversion pattern.

8. The display device of claim 4, further comprising:
a third pixel column disposed toward the second direction of the row axis from the second pixel column and which extends in the column axis; and
a second wavelength conversion pattern disposed in the third pixel column, wherein the first, second, and third pixel columns are repeatedly arranged along the row axis.

9. The display device of claim 8, wherein the second wavelength conversion pattern further includes a second indentation pattern part that is recessed toward the first direction of the row axis along the first protruding pattern part.

10. The display device of claim 1, wherein the protruding pattern part is provided in plural and includes a first protruding pattern part projected from the first main pattern part toward the second direction of the row axis.

11. The display device of claim 10, further comprising:
a second pixel column disposed toward the second direction of the row axis from the first pixel column and which extends in the column axis;
a second wavelength conversion pattern disposed along the second pixel column and which includes a first indentation pattern part recessed toward the second direction of the row axis along the first protruding pattern part;
a third pixel column disposed toward the second direction of the row axis from the second pixel column and which extends in the column axis; and
a second wavelength conversion pattern which includes a second main pattern part disposed along the third pixel column and a second protruding pattern part projected from the second main pattern part toward the first direction of the row axis.

12. The display device of claim 11, wherein the first indentation pattern part and the second protruding pattern part are disposed at a pixel row boundary.

13. The display device of claim 1, wherein the protruding pattern part is provided in plural and the protruding pattern part is not disposed at some pixel row boundaries.

14. The display device of claim 1, further comprising:
a light-shielding pattern disposed on the first substrate along pixel row boundaries and along pixel column boundaries,
wherein the light-shielding pattern overlaps with the protruding pattern part.

15. The display device of claim 1, wherein each of the plurality of light conversion patterns are spaced apart from each other.

16. The display device of claim 1, further comprising:
color filters disposed between a second substrate and the plurality of light conversion patterns.

* * * * *